(12) United States Patent
Zhao et al.

(10) Patent No.: US 11,614,468 B2
(45) Date of Patent: Mar. 28, 2023

(54) OSCILLOSCOPE NOISE FLOOR DE-EMBEDDING FOR HIGH SPEED TOGGLE SIGNAL MEASUREMENT

(71) Applicant: Intel Corporation, Santa Clara, CA (US)

(72) Inventors: Liwei Zhao, Shanghai (CN); Andrew Martwick, Portland, OR (US); Michael W. Altmann, Folsom, CA (US); Michael Mirmak, Folsom, CA (US); Kamel Ahmad, West Sacramento, CA (US); Andrew Holland, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 176 days.

(21) Appl. No.: 16/912,612

(22) Filed: Jun. 25, 2020

(65) Prior Publication Data
US 2021/0405090 A1 Dec. 30, 2021

(51) Int. Cl.
*G01R 13/02* (2006.01)

(52) U.S. Cl.
CPC .................... *G01R 13/0218* (2013.01)

(58) Field of Classification Search
CPC .................................. G01R 13/0218
See application file for complete search history.

(56) References Cited

U.S. PATENT DOCUMENTS

2005/0286627 A1* 12/2005 Tabatabaei ............ G01R 29/26
370/210
2011/0103451 A1* 5/2011 Agoston ................ H04L 1/205
375/226

* cited by examiner

*Primary Examiner* — Hyun D Park
(74) *Attorney, Agent, or Firm* — Schwabe, Williamson & Wyatt, P.C.

(57) ABSTRACT

A scheme for noise floor de-embedding by identifying a link or relationship between noise floor from an oscilloscope and phase jitter impact on a toggling signal. The scheme uses phase or electrical spectrum and phase detection for noise floor recognition. The scheme de-embeds the impact from random noise and also removes deterministic noise or jitter from the oscilloscope. The scheme provides accurate jitter analysis for a circuit (e.g., clock data recovery circuit) after de-embedding noise floor for the oscilloscope.

19 Claims, 20 Drawing Sheets

US 11,614,468 B2

OSCILLOSCOPE NOISE FLOOR DE-EMBEDDING FOR HIGH SPEED TOGGLE SIGNAL MEASUREMENT

BACKGROUND

Current methodologies for noise floor de-embedding work for low frequencies (e.g., 100 MHz or less) and require low pass filter to isolate high band jitters. Current methodologies also have long running time because a synthetic waveform is generated to carry the noise floor (e.g., for more than a million cycles).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
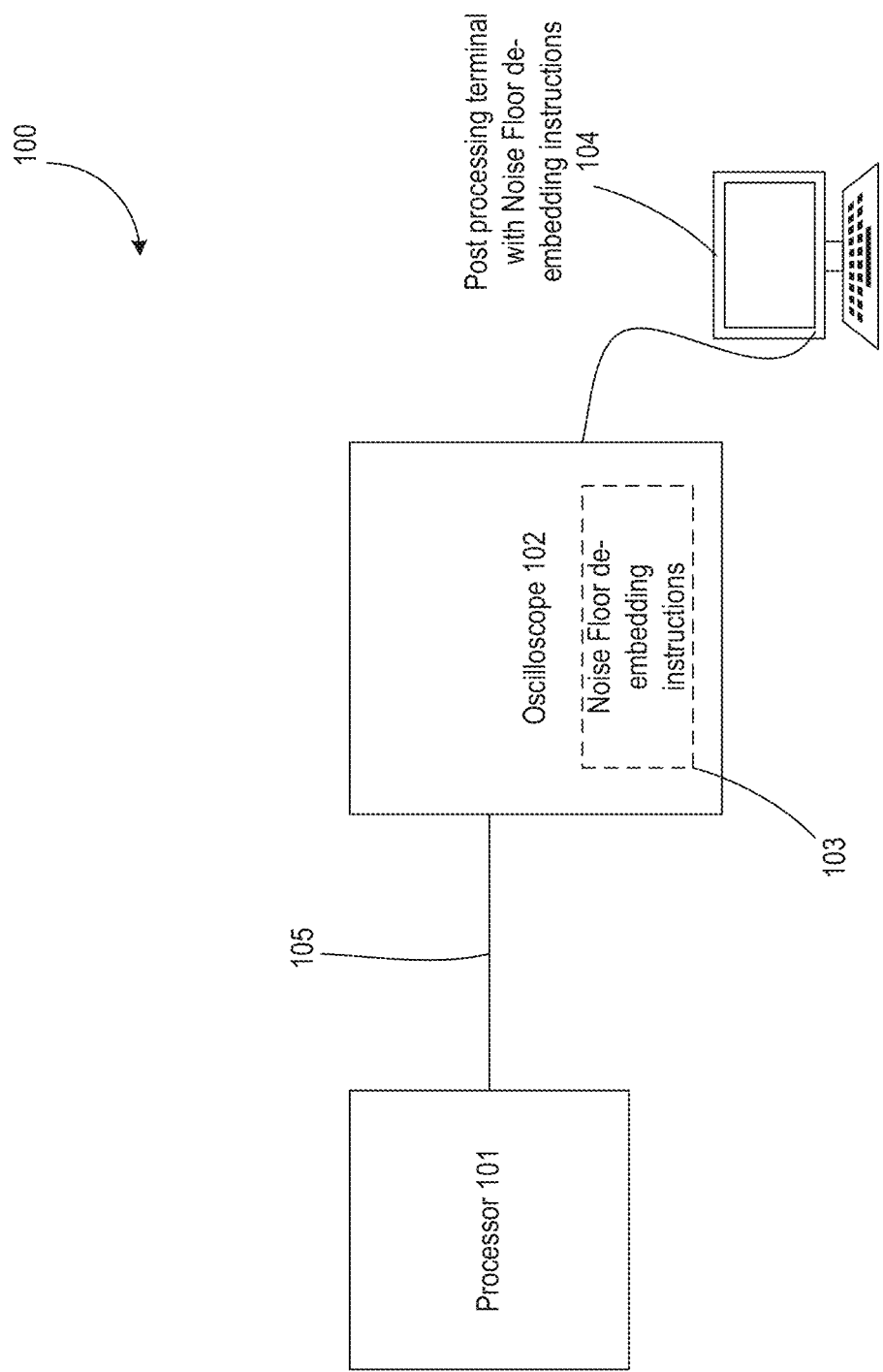
FIG. 1 illustrates a high-level system architecture for noise floor de-embedding, in accordance with some embodiments.

Various embodiments provide a scheme for noise floor de-embedding by identifying a link or relationship between noise floor from an oscilloscope and phase jitter impact on a toggling signal. Various embodiments use phase or electrical spectrum and phase detection for noise floor recognition.

The scheme comprises receiving a clock waveform from an oscilloscope, wherein the clock waveform includes noise floor waveform and toggling signal. In some embodiments, the scheme comprises reshaping the noise floor waveform based on sampling points per edges of the toggling signal. The scheme continues with squashing deterministic jitter in the toggling signal in response to reshaping the noise floor waveform, wherein the deterministic jitter is delivered from the noise floor to the toggling signal. In some embodiments, the scheme comprises controlling bandwidth of random noise of the noise floor in response to squashing the deterministic jitter such that the bandwidth of the random noise is substantially same as bandwidth of the toggling signal. The scheme continues with determining random jitter from the random noise and de-embedding the noise floor by identifying random jitter. In some embodiments, the random jitter corresponds to time uncertainty while random noise corresponds to a voltage uncertainty.

In some embodiments, reshaping the noise floor comprises determining frequency of the toggling signal and applying one of interpolation or moving average filter. For example, interpolation applied to the toggling signal if the frequency is above a threshold, and moving average filter is applied to the toggling signal if the frequency is below the threshold. In some embodiments, applying interpolation comprises applying piecewise cubic Hermite interpolating polynomial. In some embodiments, the threshold is about 100 MHz. In some embodiments reshaping the noise floor further comprises determining edges of the toggling signal after applying one of the interpolation or the moving average filter; and sampling the random noise at the edges of the toggling signal.

In some embodiments, squashing deterministic jitter comprises: applying fast Fourier transform on the clock waveform to convert the random noise from time domain into an electric spectrum, and sweeping the deterministic jitter by comparing powers of neighboring discrete points in the electrical spectrum. Power and frequency of the deterministic jitter is recorded. In some embodiments, squashing deterministic jitter further comprises reducing magnitude of the deterministic jitter to squash the deterministic jitter in response to recording power and frequency of the deterministic jitter.

In some embodiments, controlling the bandwidth of the random noise comprises: determining effective bandwidth of the random noise in the electric spectrum; multiplying the clock waveform with a transfer function of a clock data recovery circuitry; and applying inverse fast Fourier transform to convert the random noise from the electrical spectrum into time domain. In some embodiments, determining random jitter from the random noise comprises multiplying slope of the toggling signal with the random noise.

There are many technical effects of various embodiments. For example, the scheme de-embeds the impact from random noise and also removes deterministic noise or jitter from the oscilloscope. The scheme provides accurate jitter analysis for a circuit (e.g., clock data recovery circuit) after de-embedding noise floor for an oscilloscope. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal.

The meaning of "a," "an," and "the" include plural references. The meaning of "in" includes "in" and "on."

The term "analog signal" here generally refers to any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right." "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a high-level system architecture 100 for noise floor de-embedding, in accordance with some embodiments. Architecture 100 comprises processor 101 (e.g., processor as described with reference to FIG. 17), and an oscilloscope 102 (or analyzer). In some embodiments, oscilloscope 102 includes a memory having machine-executable instructions 103 for noise floor de-embedding. In some embodiments, a terminal 104 (e.g., a computing machine) is coupled to oscilloscope 102 to analyze a signal or waveform received by the oscilloscope 102. In some embodiments, terminal 104 includes a memory having machine-executable instructions 103 for noise floor de-embedding. These instructions extract random phase jitter from the noise floor. Oscilloscope 102 is coupled to processor 102 by probe 105, which may probe a fast toggling signal such as a clock in a clock data recovery (CDR) circuitry of processor 101. Any fast toggling signal may be probed by oscilloscope 102.

Oscilloscope 102 captures the fast toggling signal that includes a toggle waveform and noise floor waveform. In some embodiments, machine-executable instructions 103 for noise floor de-embedding analyzes the fast toggling signal by performing interpolation on the toggle waveform to generate time positions of edges of the toggle signal, bandwidth of the toggle signal, and slowness of the edges ($v_{OS}$·(m)) of the toggle signal. In some embodiments, machine-executable instructions 103 reshapes the noise floor with information from the toggle signal by keeping sampling points aligned with the position of toggle signal edges, and dropping other sampling points that are not aligned with the position of toggle signal edges. The information from the toggle signal used for reshaping the noise floor includes time positions of the edges and bandwidth of the toggle signal. As such, the bandwidth of the reshaped noise floor waveform is the same as the bandwidth of the toggle signal.

In some embodiments, machine-executable instructions 103 include instructions to perform fast Fourier transform (FFT) to generate a spectrum of the noise floor. The spectrum shows discrete points of high jitter, also referred to as deterministic jitter (DJ). The deterministic jitter is removed by machine-executable instructions 103 while the random jitter in spectrum is kept. Machine-executable instructions 103 then apply inverse Fourier transform (IFFT) to convert the random noise or random jitter from electrical spectrum into time domain. The time domain version of random noise provides the phase jitter from the noise floor. While the embodiments are illustrated with reference to de-embedding noise floor from a toggle signal or pattern, the scheme of various embodiments is applicable to any signal pattern on probe 105.

Figure 2:
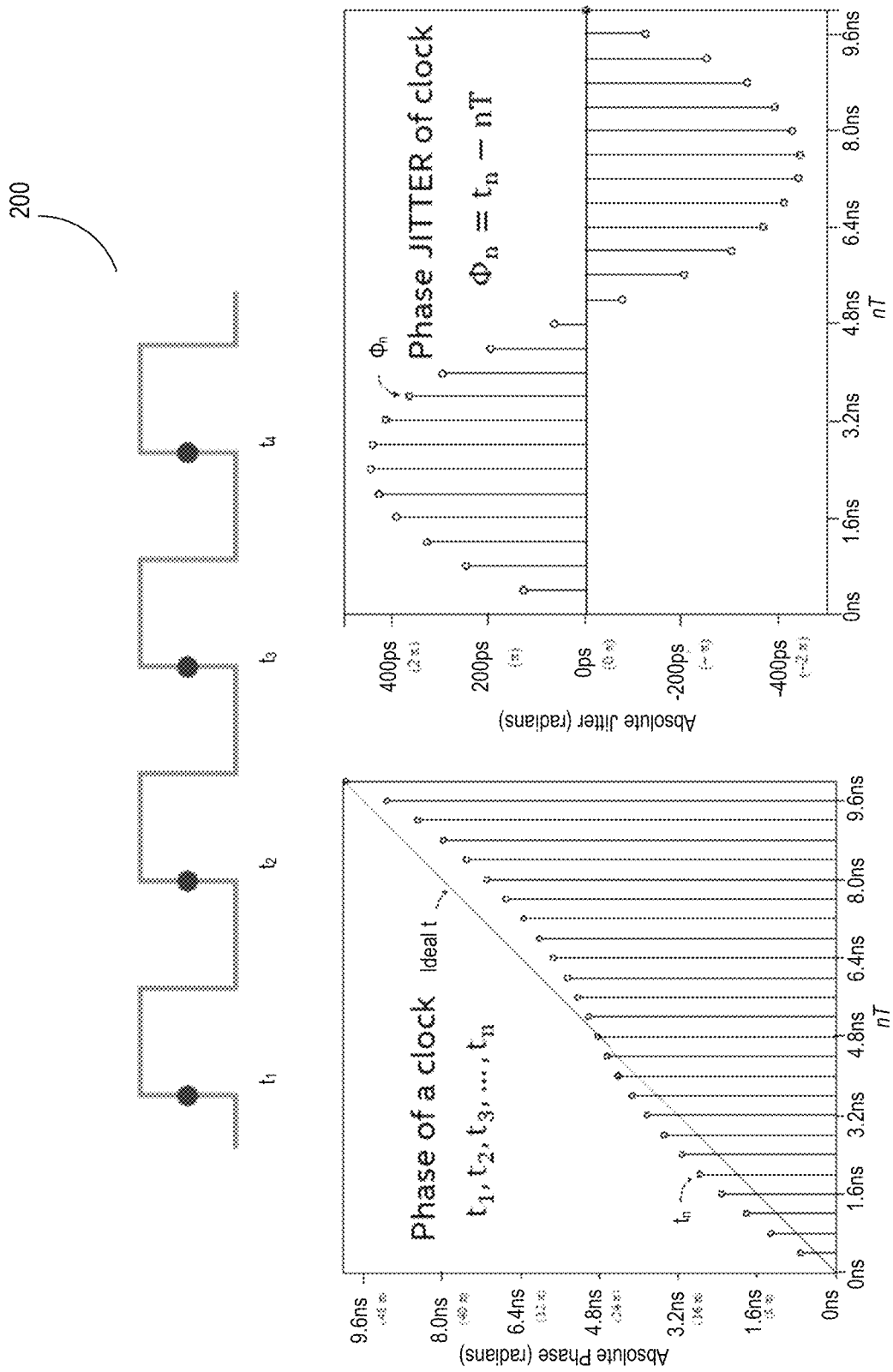
FIG. 2 illustrates plots showing clock jitter.

FIG. 2 illustrates plots showing clock jitter. Peripheral Component Interconnect Express (PCIe) specification specifies clock jitter to control sampling timing error after clock data recovery to make sure that data is captured with a wide eye (eye width and eye height). FIG. 2 shows clock timing uncertainties for both period jitter and phase jitter. To better understand the impact from clock jitter to PCIe data channel, time interval error (TIE) is defined as discussed with reference to FIG. 3.

Figure 3:
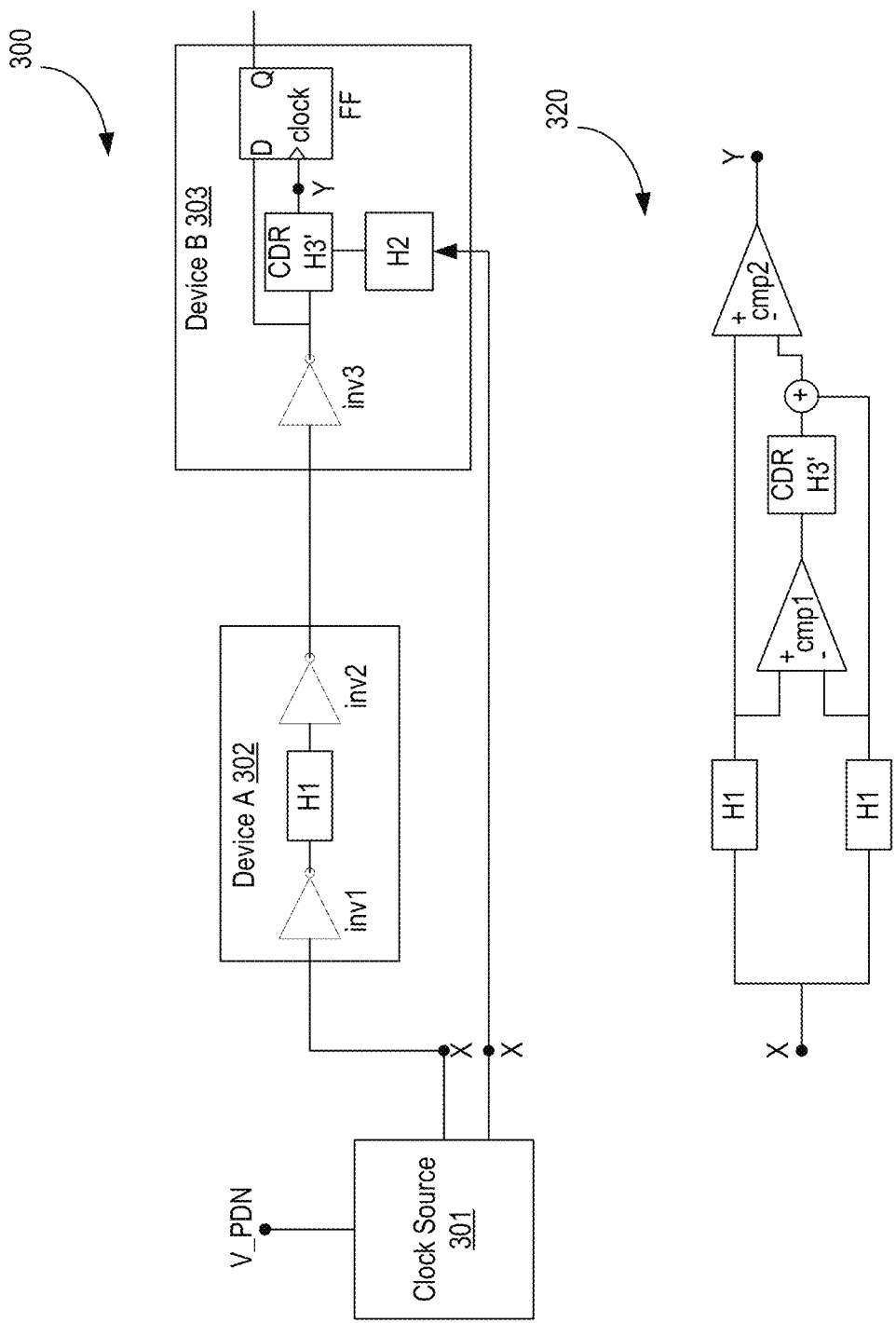
FIG. 3 illustrates a high-level clock-data recovery architecture that adds noise between clock and data.

FIG. 3 illustrates a high-level clock-data recovery architecture 300 that adds noise between clock and data. Architecture 300 illustrates a clock source 301 (e.g., a phase locked loop, frequency locked loop, or any other suitable clock source) powered by V_PDN, device A 302, and device B 303. Device A 302 is modeled by input and output inverters, inv1 and inv2, respectively and has a transfer function of H1. Device B 303 is modeled with inverter inv3, logic with transfer function H2, CDR transfer function H3', and sampling flip-flop (FF). The input clock is X and the sampling clock generated by CDR H3' is Y, which is expressed as:

$$Y = X\{H_1 - [(H_1 - H_2)H'_3 + H_2]\} \quad (1)$$

The time error at the latch or FF is illustrated by model 320. CDR adds error between the clock and data, and this clock is used to sample the data. There is a pseudo common clock between the clock and data. Clock timing uncertainty or clock jitter is a system level jitter instead of specific error of clock interface. Any distracters from the environment can modify the clock jitter value, which in turn disturbs the judgment for the entire processor system including silicon designs for clock generator and the PCIe circuitry. As such, low jitter design and accurate evaluation are desired for clock design and testing.

The specification for PCIe defines the limitation for clock jitter. As the eye margin of data decreases quickly by higher speed signals from new generation processors, the clock jitter value is specified to be much smaller for newer PCIe specification. For example, the clock jitter limitation in PCIe 4.0 specification is 0.5 ps RMS (root mean square) and 0.15 ps RMS in PCIe 5.0 specification. This jitter limitation of PCIe 5.0 specification is less than the uncertainty from the noise floor from oscilloscope 102. Jitter from a high-end oscilloscope is typically larger than 0.16 ps RMS, and the jitter from a typical oscilloscope is larger than 0.29 ps RMS. Various embodiments de-embed the oscilloscope noise floor and remove its impact from the real clock jitter number.

Figure 4:
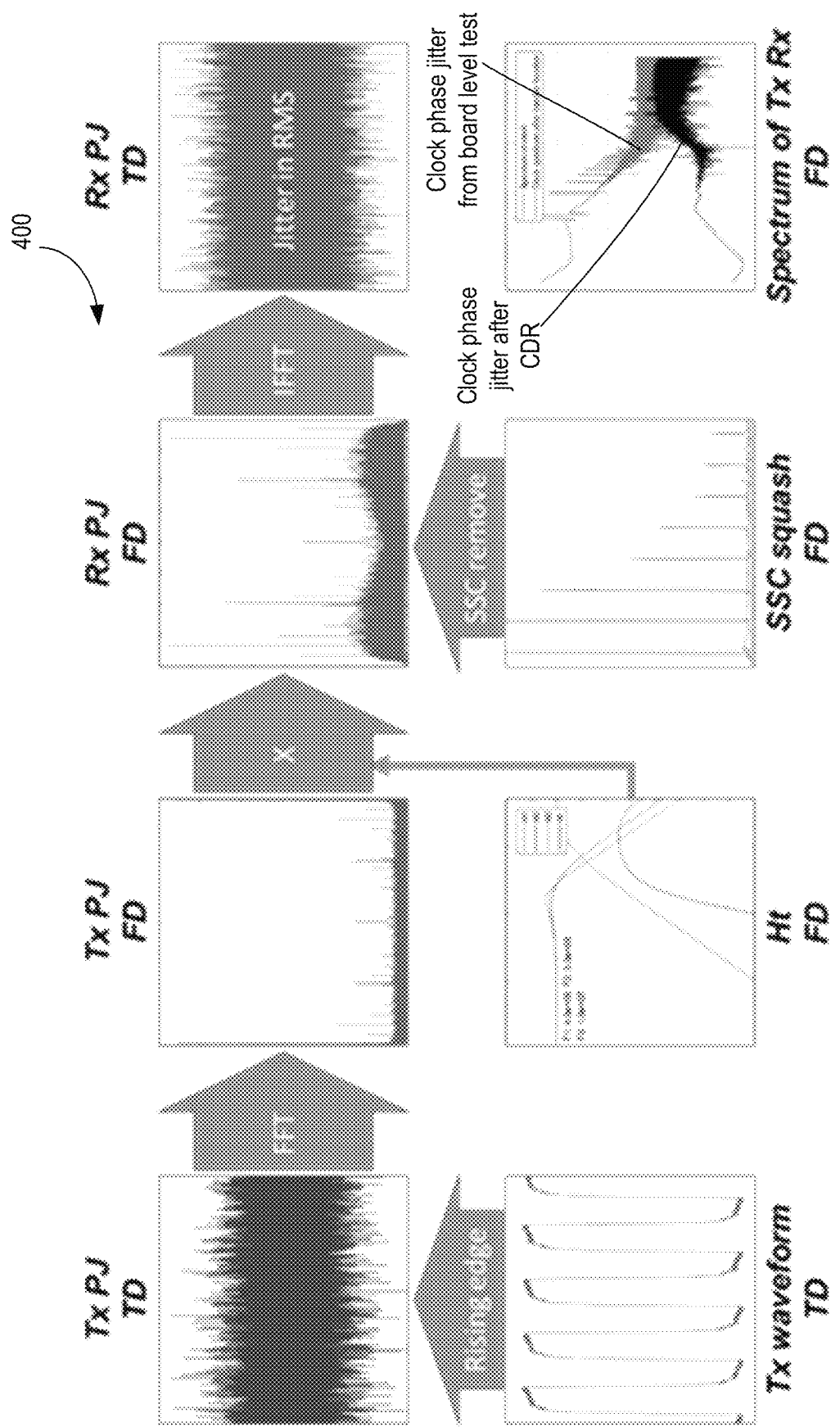
FIG. 4 illustrates a process for clock jitter analysis.

FIG. 4 illustrates a process 400 for clock jitter analysis. The clock jitter analysis starts with clock waveform capture by an oscilloscope. This captured waveform is Tx waveform (or transmitter waveform). Here, TD refers to time domain, FD refers to phase distribution, PJ refers to phase jitter, and Rx refers to receiver. Tx PJ are the crossing points between captured timing position and expected ideal timing position. Deterministic jitter and phase jitter can be achieved from this timing error array. Tx PJ transfers over by FFT from time domain to spectrum (frequency domain). The phase spectrum of clock timing error is multiplied with transfer functions.

There are three different transfer functions for the PCIe clock. Each transfer function shows the jitter behavior of a specific part of a system (e.g., Tx phase locked loop (PLL), Rx PLL, and Rx CDR). After applying all transfer functions, the clock jitter achieved from board level test is applied to silicon level jitter after Tx CDR (e.g., at point Y). Here SSC (spectrum spread) squash is a step to remove deterministic jitter from spectrum spread. The two curves at the bottom right of FIG. 4 show the comparison between clock phase jitter from board level test and jitter after CDR impact to Tx sampling clock. The RMS jitter in PCIe specification is calculated as RMS value of clock phase jitter after CDR.

Figure 5:
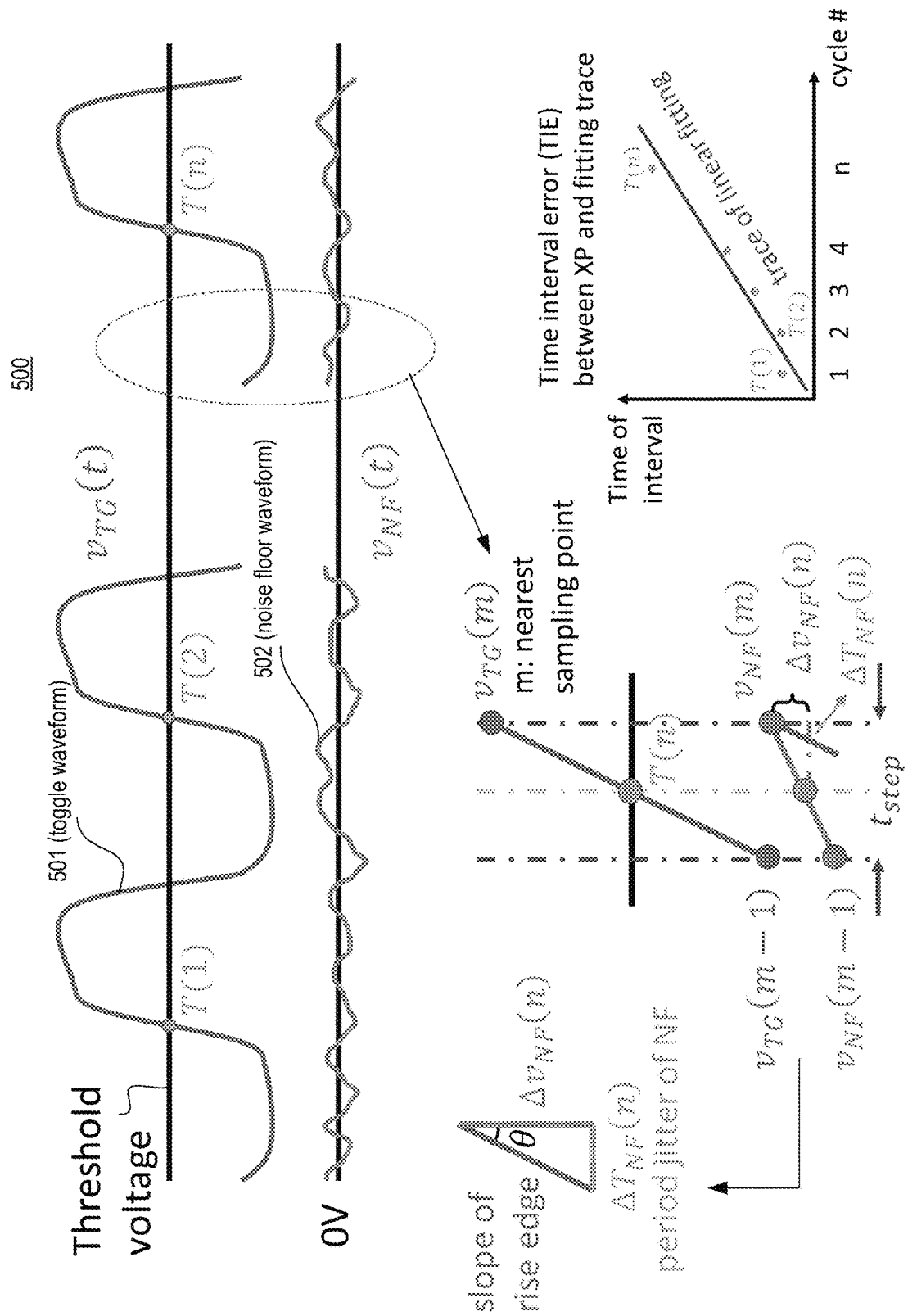
FIG. 5 illustrates the theoretical basis for the scheme for noise floor de-embedding, in accordance with some embodiments.

FIG. 5 illustrates the theoretical basis 500 for the scheme for noise floor de-embedding, in accordance with some embodiments. It is challenging to implement the clock jitter process for noise floor waveform directly because there are no rising edges to check the phase status for the noise floor. In some embodiments, edges (ideal edges) at time points T(1), T(2), . . . T(n) are generated to carry the oscilloscope noise floor. These ideal edges support phase recognition without new phase impact to the noise floor. The ideal edges or synthetic edges are generated as new waveforms by repeating sampling position (or timing position). The phase jitter from these synthetic edges is always 0 because the edges can always hit the ideal timing position or sampling point for each clock cycle. After overlapping the noise floor waveform with the new synthetic edges, the new edged noise floor waveform is generated. The edged noise floor depends on the slope of the edges. The slope of the edges is an intermediary between the noise floor and the crossing point (phase jitter) between toggle waveform 501 and threshold. As such, an equation can be determined between the slope, noise floor, and jitter. The synthetic edges are generated with slopes exactly (or substantially exactly) same with the slope of the original clock capture (e.g., toggle waveform 501). The theory can be simplified as a triangle shown in FIG. 5.

Here, $v_{TG}(t)$ is a function of toggle waveform 501 without impact from oscilloscope 102. T(n) is the time of $n^{th}$ crossing point between vTG(t) and threshold voltage $V_{thresh}$. $v_{NF}(t)$ is a function of the noise floor waveform 502 generated by oscilloscope 102. $T_{fit}(n)$ is set as the ideal crossing point time of the $n^{th}$ cycle, and is calculated by linear fitting. The period jitter of $v_{TG}(t)$ is given as:

$$\Delta T(n) = T(n) - T(n-1) - T_{fit}(n)/n \quad (2)$$

Phase jitter of $v_{TG}(t)$ is given as:

$$p(n) = \sum_{i=1}^{n} \Delta T(i) \quad (3)$$

Figure 6A:
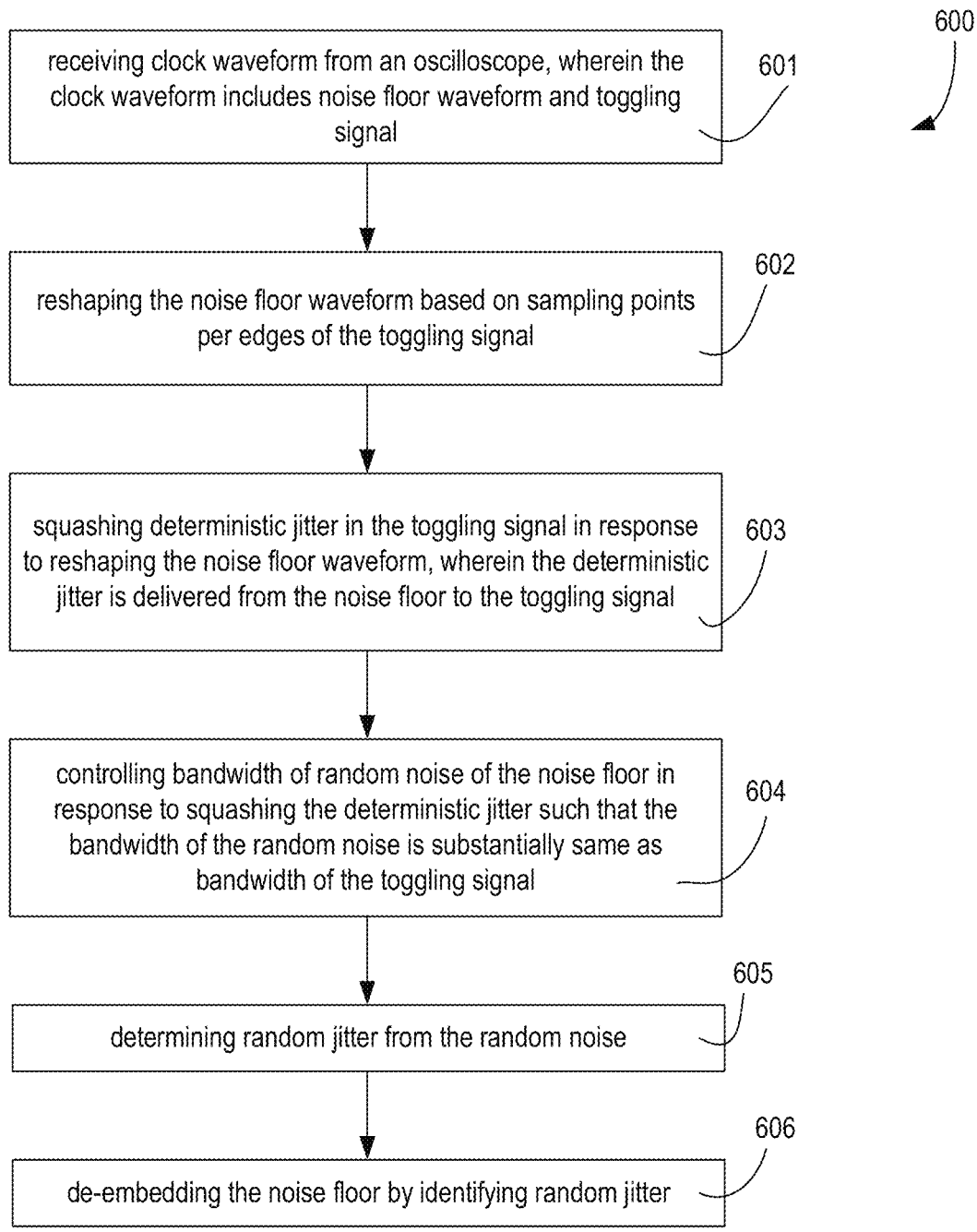
FIGS. 6A-D illustrate flowcharts of a method or scheme for noise floor de-embedding, in accordance with some embodiments.
Figure 6B:
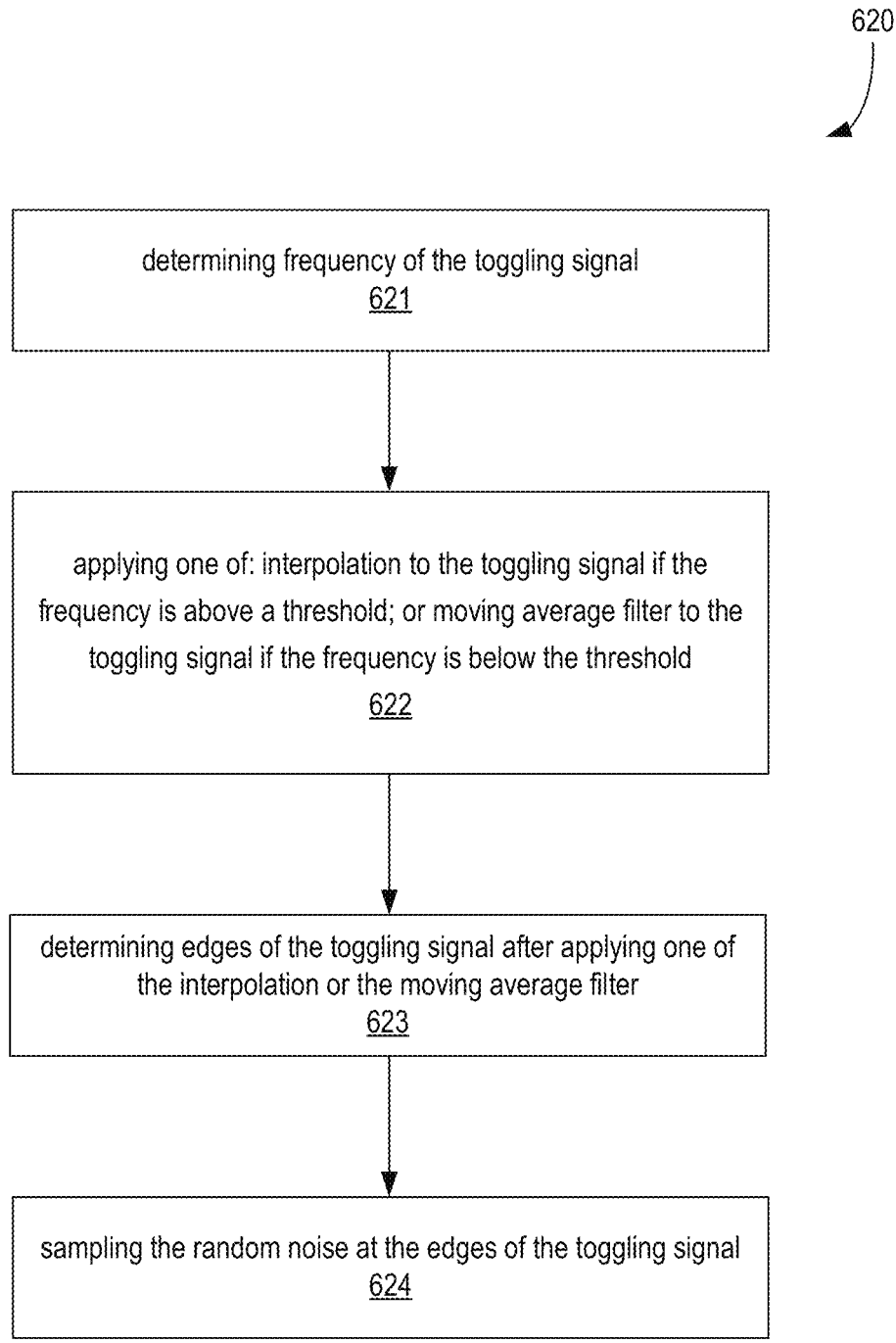
Figure 6C:
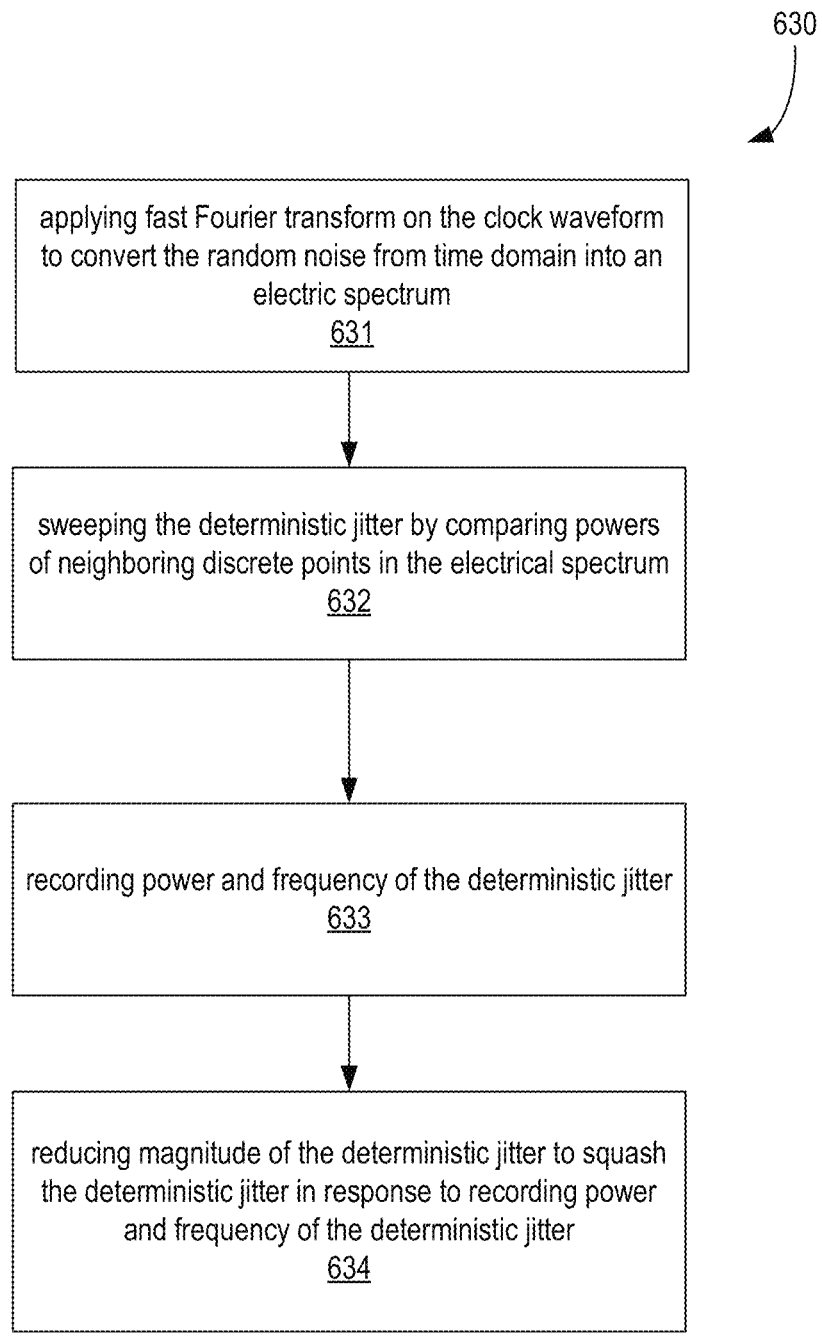
Figure 6D:
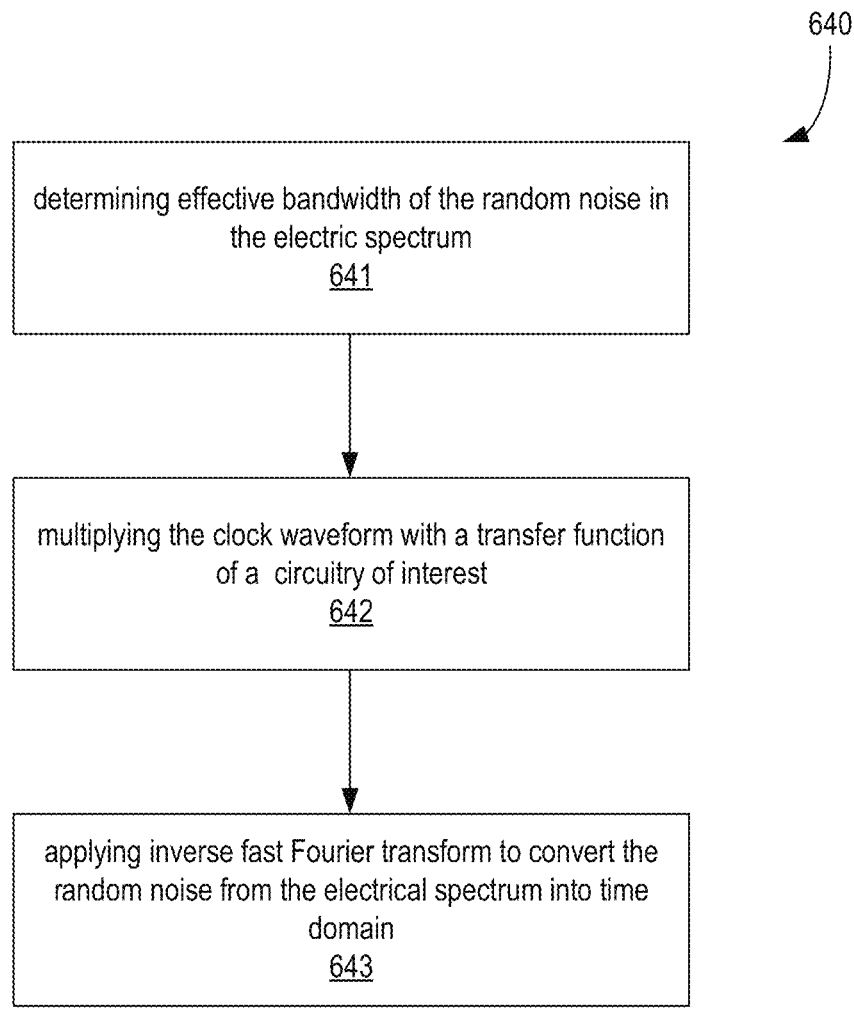

FIGS. 6A-D illustrate flowcharts 600, 620, 630, and 640, respectively, of a method or scheme for noise floor de-embedding, in accordance with some embodiments. While the blocks are shown in a particular order, the order can be modified. For example, some blocks can be performed in parallel to other blocks. The method flowcharts of FIGS. 6A-B are implemented as machine-readable or machine-executable instructions. These machine-readable or machine-executable instructions are stored in a machine-readable storage medium.

At block 601, clock waveform from oscilloscope 102 is received, wherein the clock waveform includes noise floor waveform and toggling signal. At block 602, the noise floor waveform is reshaped based on sampling points per edges of the toggling signal. Reshaping of the noise floor is described with reference to flowchart 620 of FIG. 6B.

At block 621, frequency of the toggling signal is determined. At block 622, one of interpolation or moving average filter is applied. In some embodiments, interpolation is applied to the toggling signal if the frequency is above a threshold. In some embodiments, applying interpolation comprises applying piecewise cubic Hermite interpolating polynomial. In some embodiments, moving average filter is applied to the toggling signal if the frequency is below the threshold. In some embodiments, the threshold is about 100 MHz. Other values for the threshold may be selected. The threshold is programmable threshold. At block 623, edges of the toggling signal are determined after applying one of the interpolation or the moving average filter. At block 624, the random noise is sampled at the edges of the toggling signal.

Referring back to FIG. 6A, at block 603, deterministic jitter is squashed in the toggling signal in response to reshaping the noise floor waveform, wherein the deterministic jitter is delivered from the noise floor to the toggling signal. The process of squashing deterministic jitter is described with reference flowchart 630 of FIG. 6C. At block 631, FFT is applied on the clock waveform to convert the random noise from time domain into an electric spectrum. At block 632, deterministic jitter is swept by comparing powers of neighboring discrete points in the electrical spectrum. At block 633, power and frequency of the deterministic jitter is recorded. At block 634, magnitude of the deterministic jitter is reduced to squash the deterministic jitter in response to recording power and frequency of the deterministic jitter.

Referring back to FIG. 6A, at block 604 bandwidth of random noise of the noise floor is controlled in response to squashing the deterministic jitter such that the bandwidth of the random noise is substantially same as bandwidth of the toggling signal. The process of controlling bandwidth of the random noise of the noise floor is described with reference to flowchart 640 of FIG. 6D. At block 641, effective bandwidth of the random noise in the electric spectrum is determined. At block 642, the clock waveform is multiplied with a transfer function per request. The transfer function may be of a circuitry. In some embodiments, the transfer function is of a clock data recovery circuitry. In some embodiments, block 642 can be skipped. At block 643, inverse fast Fourier transform is applied to convert the random noise from the electrical spectrum into time domain. Referring back to FIG. 6A, at block 605 random jitter is determined from the random noise. In some embodiments, determining random jitter from the random noise comprises multiplying slope of the toggling signal with the random noise. At block 606, the noise floor is de-embedded by identifying random jitter, where the random jitter corresponds to time uncertainty while random noise corresponds to a voltage uncertainty.

Program software code/instructions associated with the flowcharts (and/or various embodiments) and executed to implement embodiments of the disclosed subject matter may be implemented as part of an operating system or a specific application, component, program, object, module, routine, or other sequence of instructions or organization of sequences of instructions referred to as "program software code/instructions," "operating system program software code/instructions," "application program software code/instructions," or simply "software" or firmware embedded in processor. In some embodiments, the program software code/instructions associated with the flowcharts (and/or various embodiments) are executed by oscilloscope 102 or terminal 104.

Here, the computer executable storage medium is a tangible machine readable medium that can be used to store program software code/instructions and data that, when executed by a computing device, causes one or more processors to perform a method(s) as may be recited in one or more accompanying claims directed to the disclosed subject matter.

The tangible machine readable medium may include storage of the executable software program code/instructions and data in various tangible locations, including for example ROM, volatile RAM, non-volatile memory and/or cache and/or other tangible memory as referenced in the present application. Portions of this program software code/instructions and/or data may be stored in any one of these storage and memory devices. Further, the program software code/instructions can be obtained from other storage, including, e.g., through centralized servers or peer to peer networks and the like, including the Internet. Different portions of the software program code/instructions and data can be obtained at different times and in different communication sessions or in the same communication session.

The software program code/instructions and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines or other sequences of instructions or organization of sequences of instructions, by way of example. Thus, it is not required that the data and instructions be on a tangible machine readable medium in entirety at a particular instance of time.

Examples of tangible computer-readable media include but are not limited to recordable and non-recordable type media such as volatile and non-volatile memory devices, read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs), etc.), among others. The software program code/instructions may be temporarily stored in digital tangible communication links while implementing electrical, optical, acoustical or other forms of propagating signals, such as carrier waves, infrared signals, digital signals, etc. through such tangible communication links.

In general, tangible machine readable medium includes any tangible mechanism that provides (i.e., stores and/or transmits in digital form, e.g., data packets) information in a form accessible by a machine (i.e., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Galaxy®, Blackberry® Droid®, or the like, or any other device including a computing device. In one embodiment, processor-based system is in a form of or included within a PDA (personal digital assistant), a cellular phone, a notebook computer, a tablet, a game console, a set top box, an embedded system, a TV (television), a personal desktop computer, etc. Alternatively, the traditional communication applications and subsidized application(s) may be used in some embodiments of the disclosed subject matter.

Figure 7:
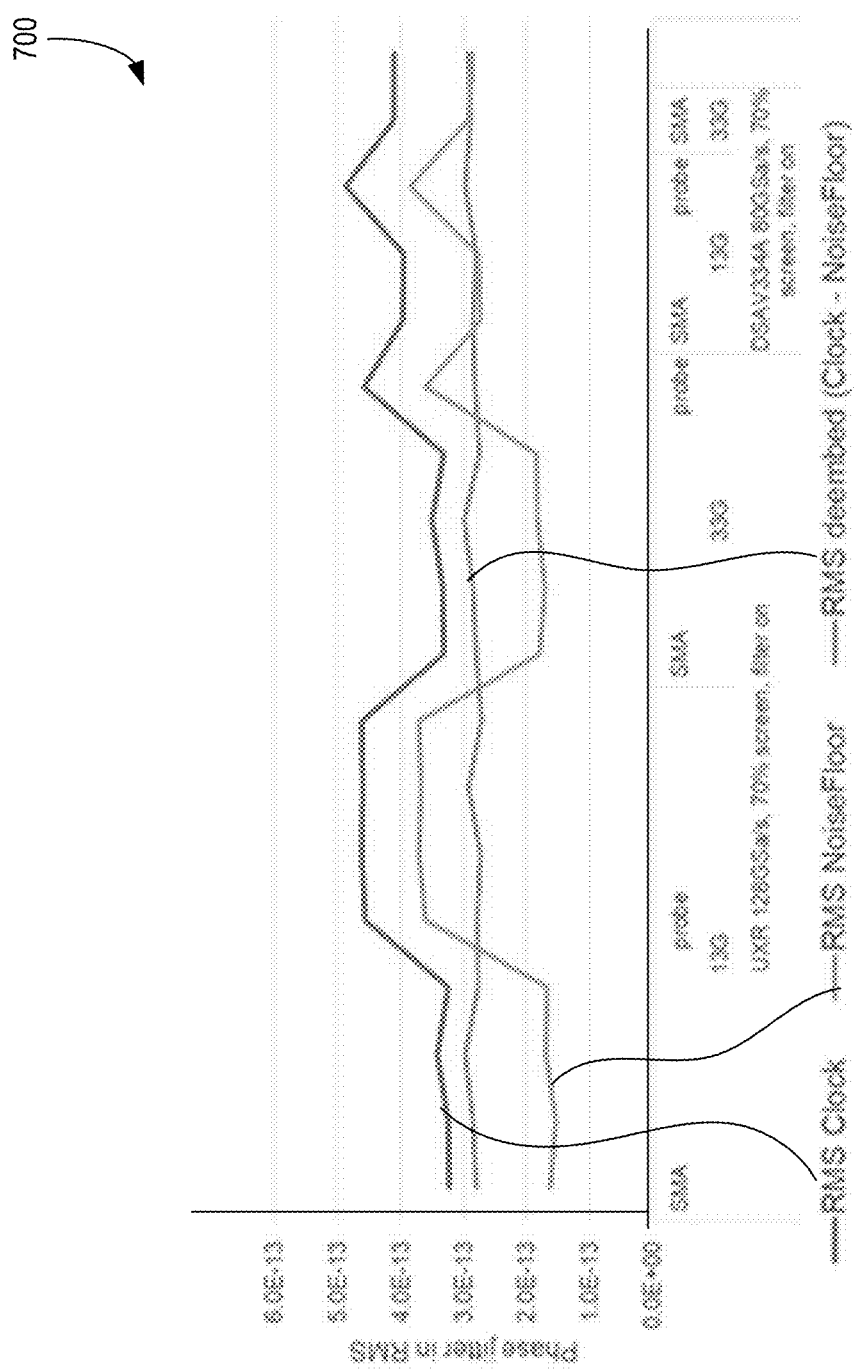
FIG. 7 illustrates a plot showing operation of the noise floor de-embedding, in accordance with some embodiments.

FIG. 7 illustrates plot 700 showing operation of the noise floor de-embedding, in accordance with some embodiments. In some embodiments, a low pass filter (e.g., dynamic infinite impulse response (IIR) filter) is added for PCIe 100 MHz clock jitter analysis. This dynamic IIR filter is designed to remove the jitters higher than the knee frequency of the clock. Since PCIe clock is 100 MHz, with not so fast edges, the knee frequency is usually lower than 2 GHz. In this case, oscilloscope deterministic jitter is solved by a 2 GHz low pass filter. Plot 700 shows noise floor de-embedding for a slow clock (e.g., 100 MHz clock). For clocks or toggle signals with frequencies higher than 100 MHz (e.g., in the GHz range), in a given signal window from oscilloscope 102, there are merely few sampling points per toggle cycle which results in missing accurate crossing point locations. As such, toggle or synthetic edge waveforms are not identified leading to incorrect jitter distribution. In this case, deterministic jitter cannot be removed by an additional low pass filter because the deterministic jitter show widely in a whole band of signals outside of the low pass cut off frequency.

Figure 8:
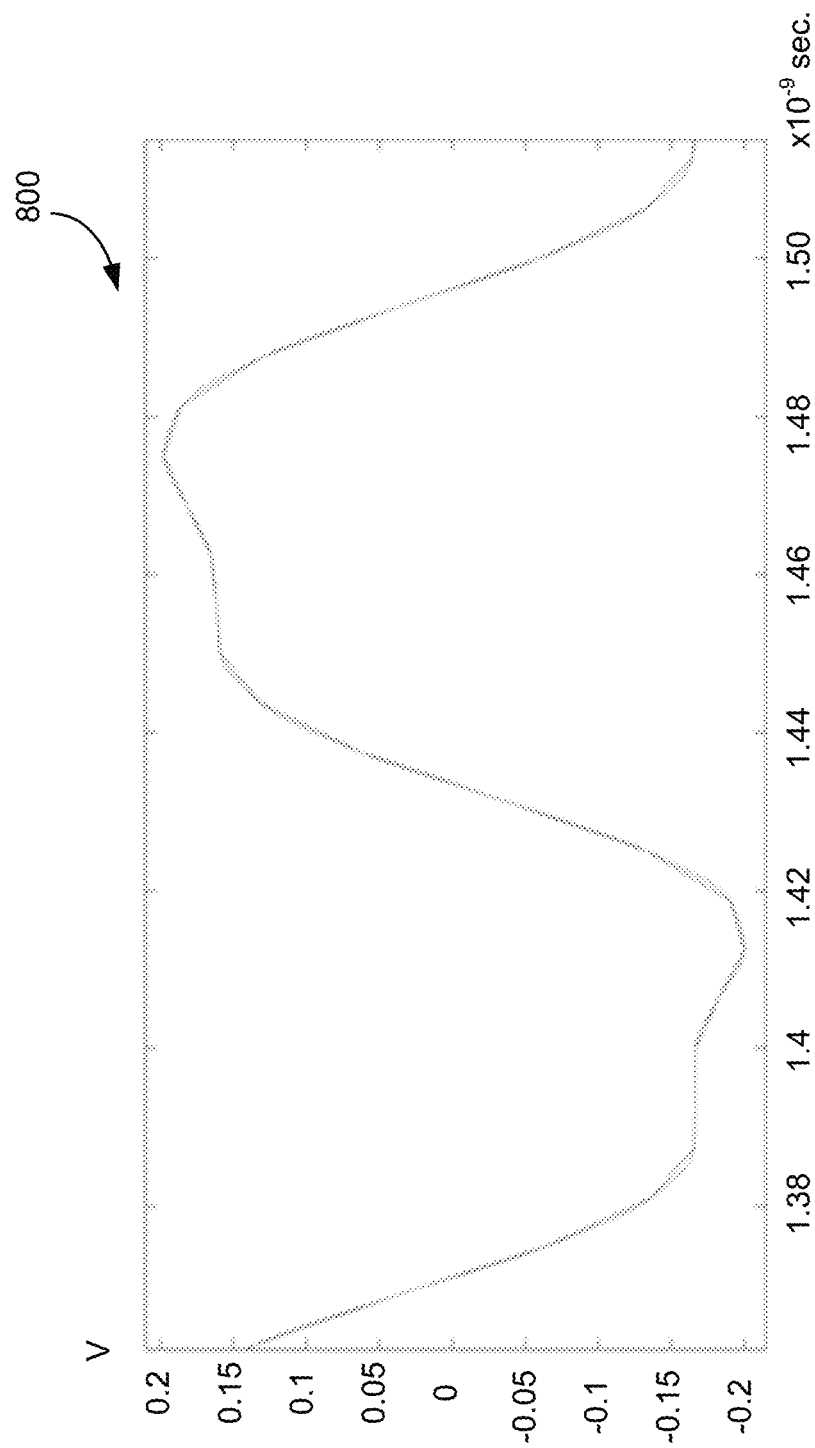
FIG. 8 illustrates a plot showing efficiency of interpolation used for clock jitter analysis, in accordance with some embodiments.

FIG. 8 illustrates plot 800 showing efficiency of interpolation used for clock jitter analysis, in accordance with some embodiments. In some embodiments, the problem of missing accurate crossing points because of very few sampling points per cycles when the toggle signal or pattern is in GHz range, is solved using interpolation. For example, for an oscilloscope with 160 Gsa sampling rate for PCIe 50.0 toggle signal (e.g., 16 GHz), merely 10 points per cycle and 2 to 3 crossing points for each rising edge are available. Compared to the 100 MHz clock as described with reference to FIG. 7, about 1600 crossing points per cycle are available. So, the linearity and precision near crossing points is much worse when the toggle signal is of high frequency (e.g., 16 GHz and higher). Not having enough crossing points results in incorrect phase jitter.

Various embodiments solve the problem using Sinx/x interpolation in oscilloscope 102. In some embodiments, PCHIP (piecewise cubic Hermite interpolating polynomial) algorithm is used for interpolation instead of the interpolation offered by a typical high-end oscilloscope. One benefit of PCHIP is that it can keep and track the slope of the captured data. Plot 800 is part of a waveform with two waveforms superimposed. One of the waveforms is the toggle signal captured by oscilloscope 102 and the other waveform is the result of interpolation (with 10 new points for each captured point). From the middle of the rising edge of the waveform near 0 V, the slope of the two waveforms track each other resulting in accurate calculation of the slopes and crossing points. Interpolation (e.g., using PCHIP) results in new waveform (interpolated waveform) for jitter analysis as illustrated by FIG. 9.

Figure 9:
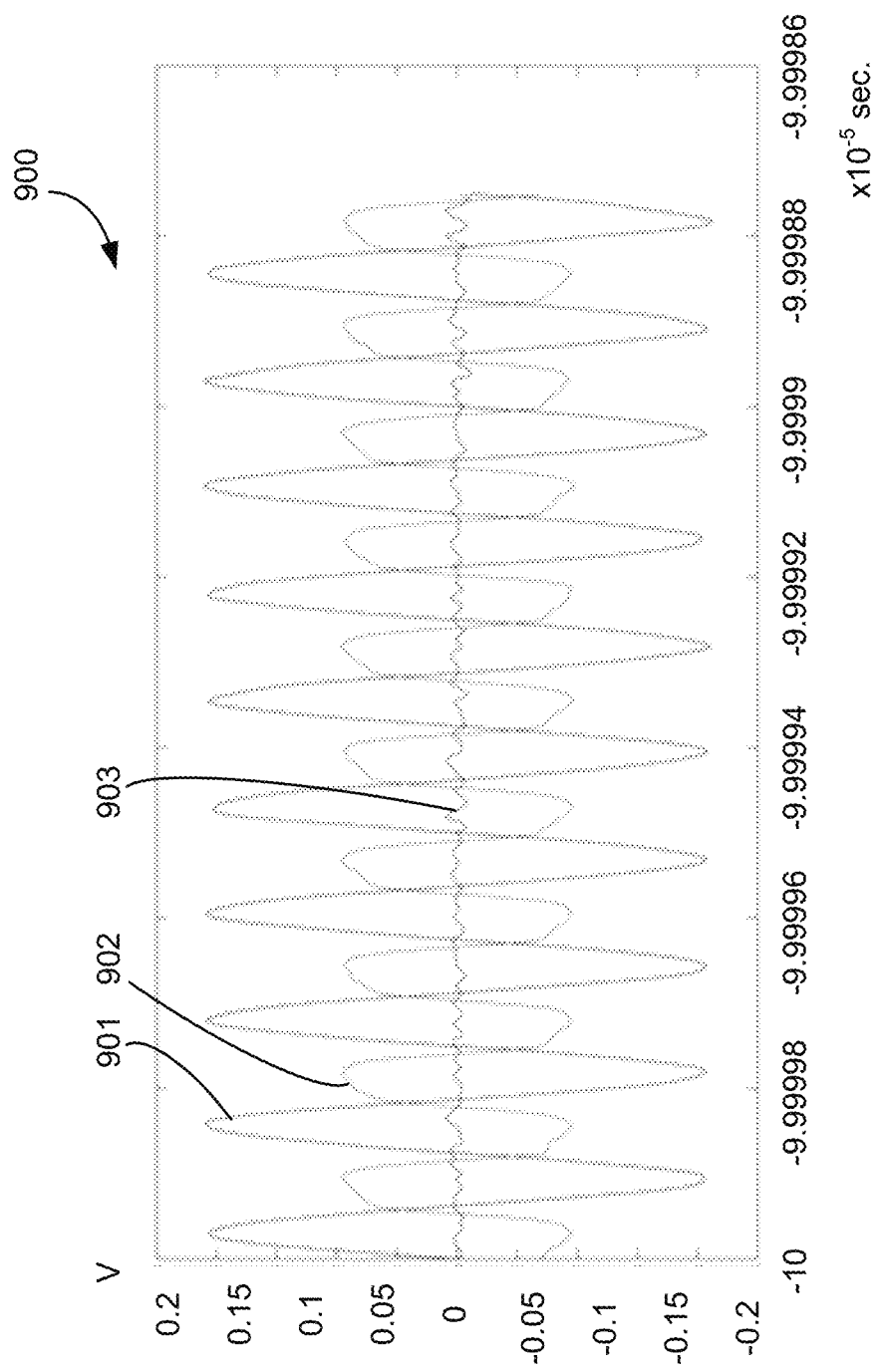
FIG. 9 illustrates a plot showing waveforms for jitter analysis after interpolation, in accordance with some embodiments.

FIG. 9 illustrates plot 900 showing waveforms for jitter analysis after interpolation, in accordance with some embodiments. Here, waveform 901 is the synthetic edge to carry noise floor, waveform 902 is the new toggle signal, and waveform 903 is the new noise floor waveform. For synthetic edges, sine signal is used instead of clipped sine signal as used in the 100 MHz clock. The sine waveform impacts total jitter distribution as merely one deterministic frequency point and can simplify the jitter separate for later process. As discussed with reference to FIG. 7, incorrect edges for toggle or synthetic edges results in incorrect power distribution. This problem is resolved using interpolation. Waveform 901 shows linearity near 0 V is much better than the one without interpolation.

Figure 10:
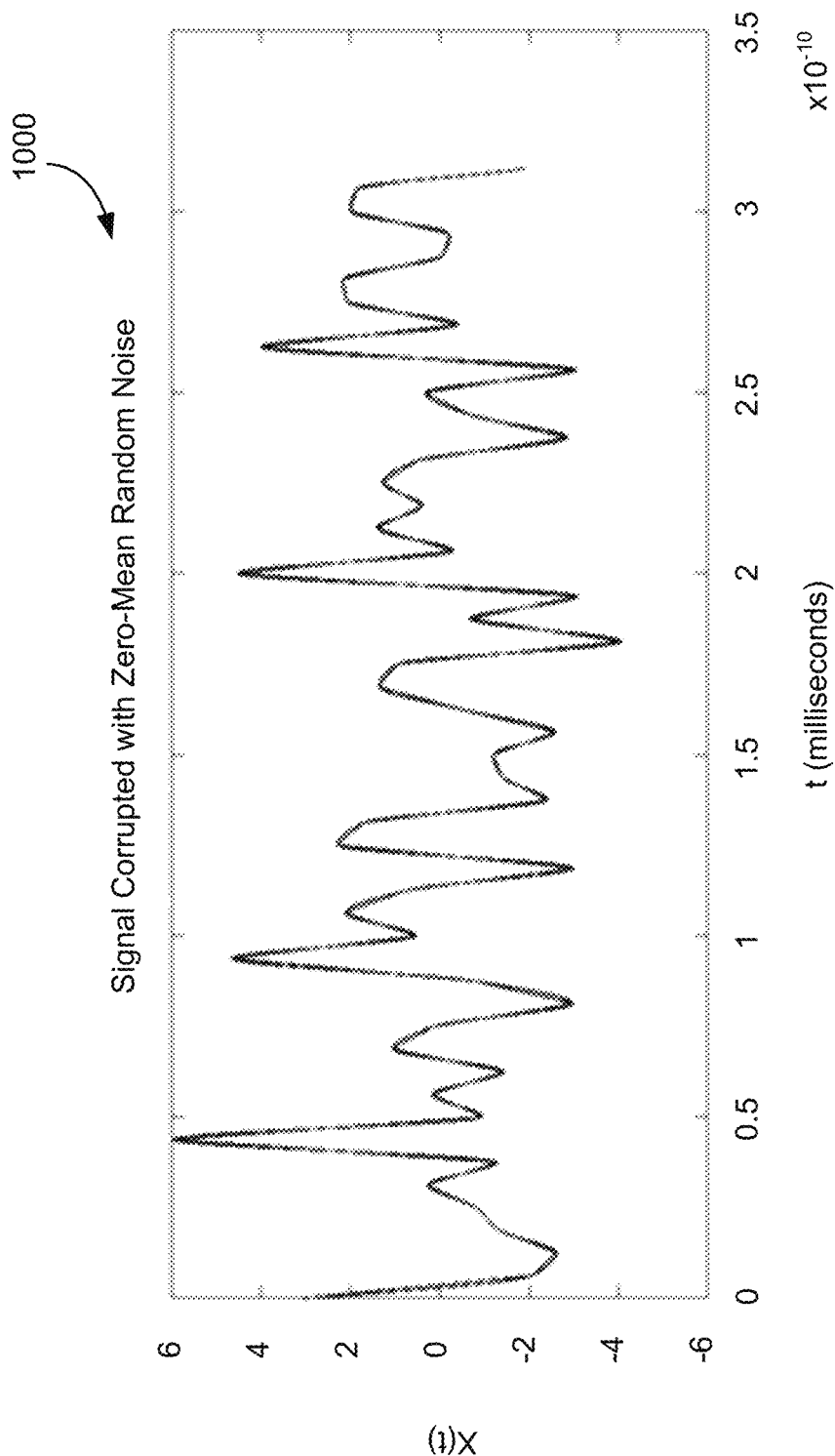
FIG. 10 illustrates a plot showing captured data vs. interpolation result, in accordance with some embodiments.

FIG. 10 illustrates plot 1000 showing captured data vs. interpolation results, in accordance with some embodiments. In this case, two deterministic jitters are added for a 16 GHz for toggle PCIe 5.0 with 700 mV swing. The two deterministic jitters are 12 GHz as large deterministic jitter from a test system with 300 mV swing, and 2 ps RMS random jitter from thermal noise. The waveform is captured by a 160 Gsa oscilloscope. The two waveforms in plot 1000 are nearly identical and superimpose on each other. One of the waveforms is the actual captured waveform from the oscilloscope while the other is the interpolated waveform. Plot 1000 shows the efficacy of using interpolation.

Figure 11:
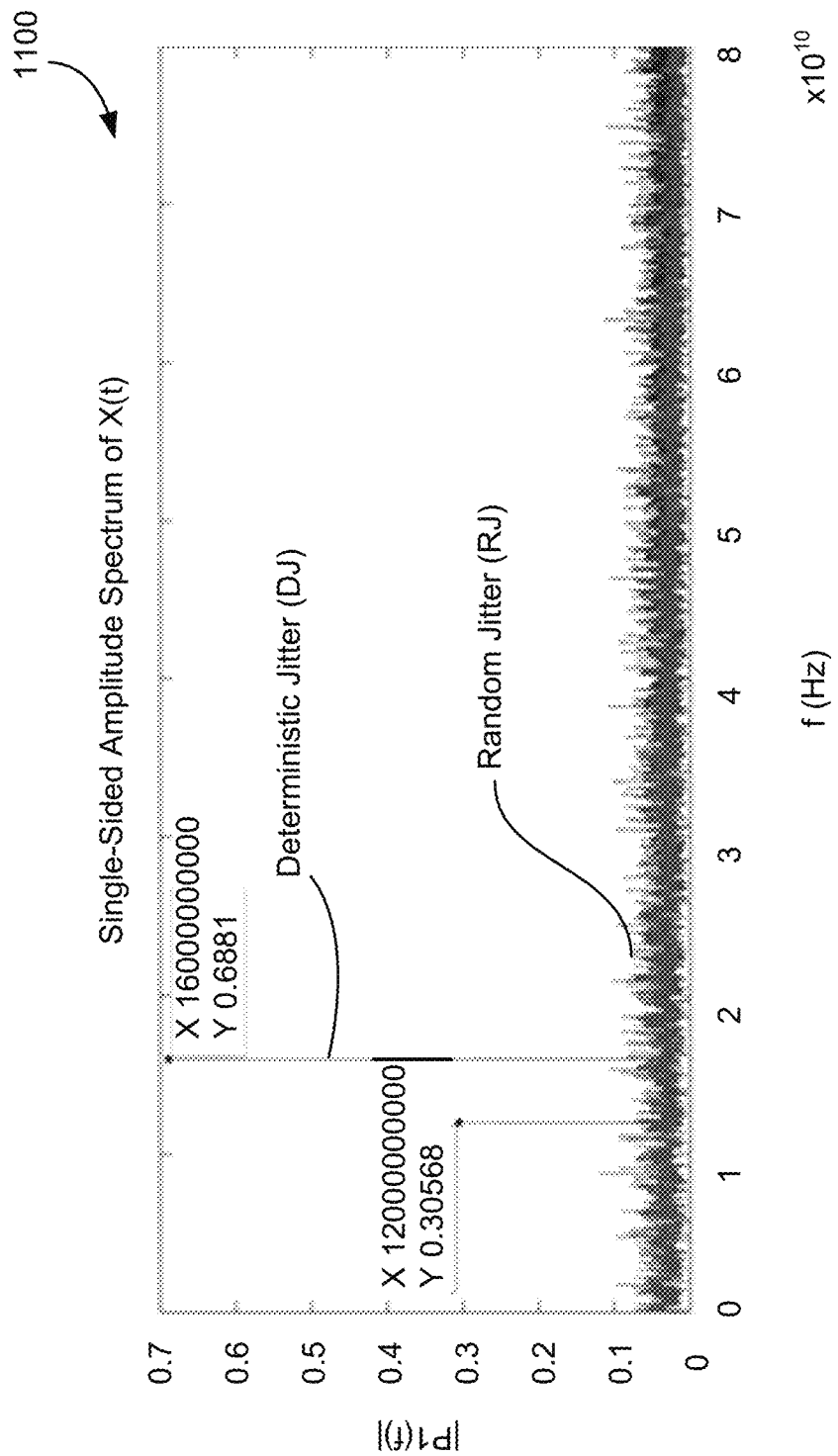
FIG. 11 illustrates a plot showing phase spectrum, in accordance with some embodiments.

FIG. 11 illustrates plot 1100 showing phase spectrum, in accordance with some embodiments. In various embodiments, the power of deterministic jitters are kept same with interpolation. The lower band of random jitter is also same using interpolation. In some cases, the difference from interpolation is shown as jitter attenuation in the high frequency band. As discussed with reference to FIG. 7, deterministic jitters at high frequency bands cannot be removed by additional low pass filter. In some embodiments, an additional mechanism is used to squash the deterministic error spikes.

Figure 12:
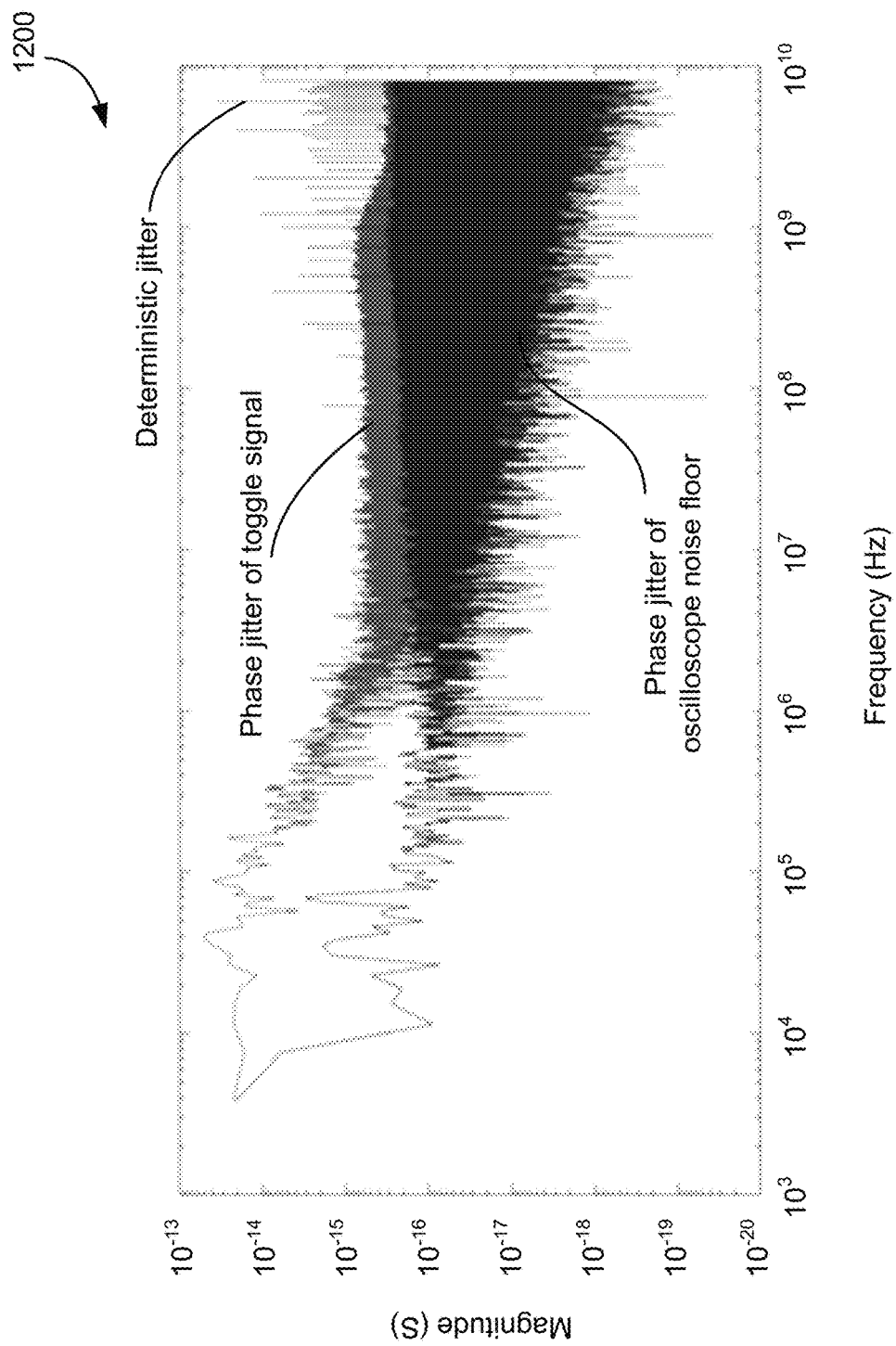
FIG. 12 illustrates a plot showing phase spectrum distribution with high deterministic error spikes, in accordance with some embodiments.

FIG. 12 illustrates plot 1200 showing phase spectrum distribution with high deterministic error spikes, in accordance with some embodiments. Plot 1200 is an example of phase spectrum distribution of 16 GHz toggle signal from bit error rate tested by 160 Gsa oscilloscope. Plot 1200 shows the phase jitter of the toggle signal and phase jitter of oscilloscope noise floor. The spikes in the GHz band for both the phase jitter waveforms are deterministic jitter mainly delivered from oscilloscope noise floor to the captured toggle signal. For better jitter analysis, various embodiments separate the random jitter from deterministic jitter. Without such separation, random jitter RMS value is different with its real value. In some embodiments, phase of spikes is kept constant and absolute (or magnitude) values of spike is decreased of squashed as shown in FIG. 13.

Figure 13:
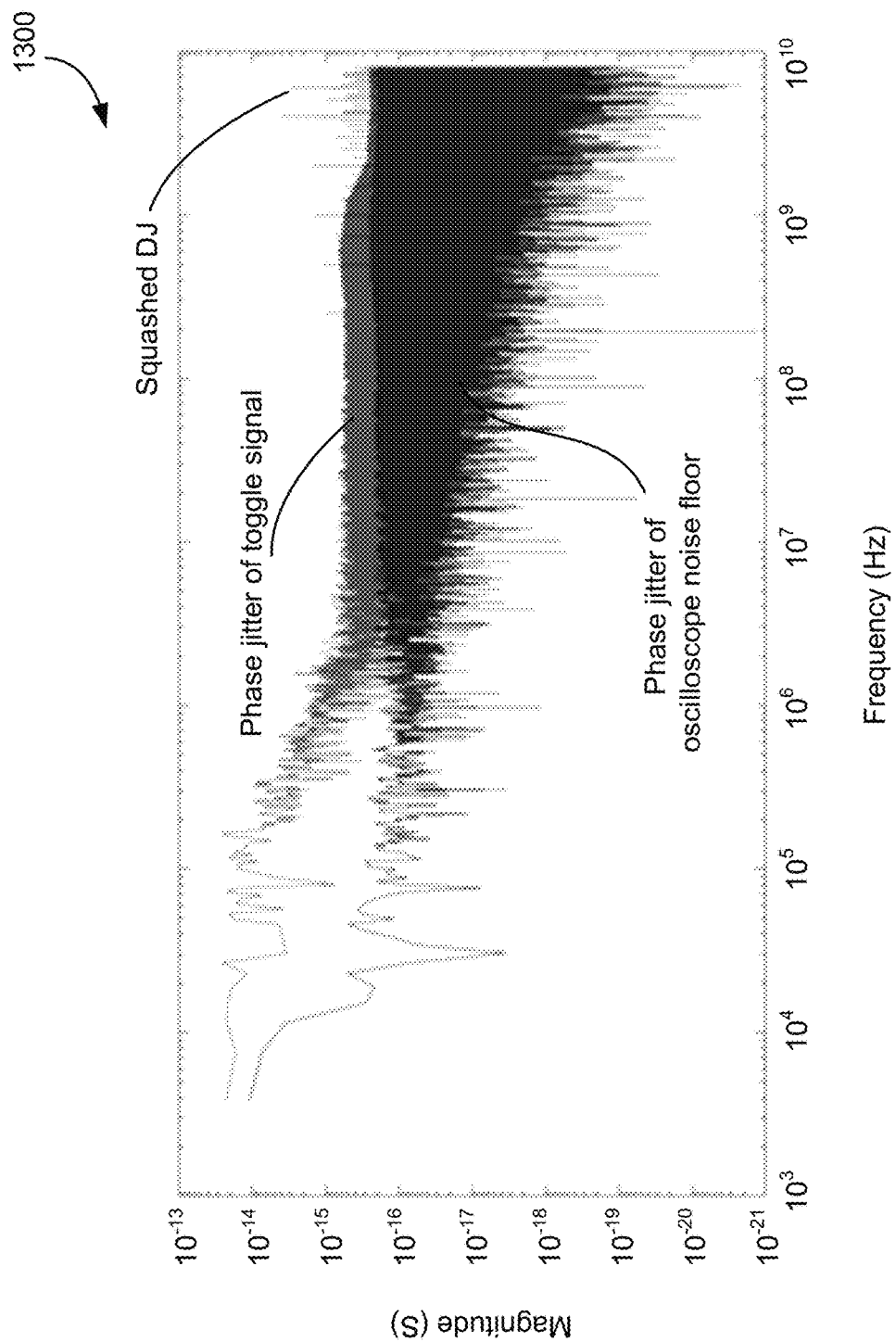
FIG. 13 illustrates a plot showing phase spectrum distribution with squashed deterministic error spikes, in accordance with some embodiments.

FIG. 13 illustrates plot 1300 showing phase spectrum distribution with squashed deterministic error spikes, in accordance with some embodiments. In some embodiments, Euler's formula is the basis for keeping phase of spikes constant and squashing magnitude of deterministic jitter. The ratio between sine and cosine is fixed because they relate to the phase of sampling points while the factor for sine and cosine is decreased until their absolute values meet the target. While the high magnitude spikes are reduced or removed, there are still some spikes in plot 1300, which are special spikes that do not intersect between toggle signal and noise floor.

As such, oscilloscope noise floor is analyzed using phase jitter analysis to achieve accurate jitter values for both random jitter and phase jitter.

Figure 14:
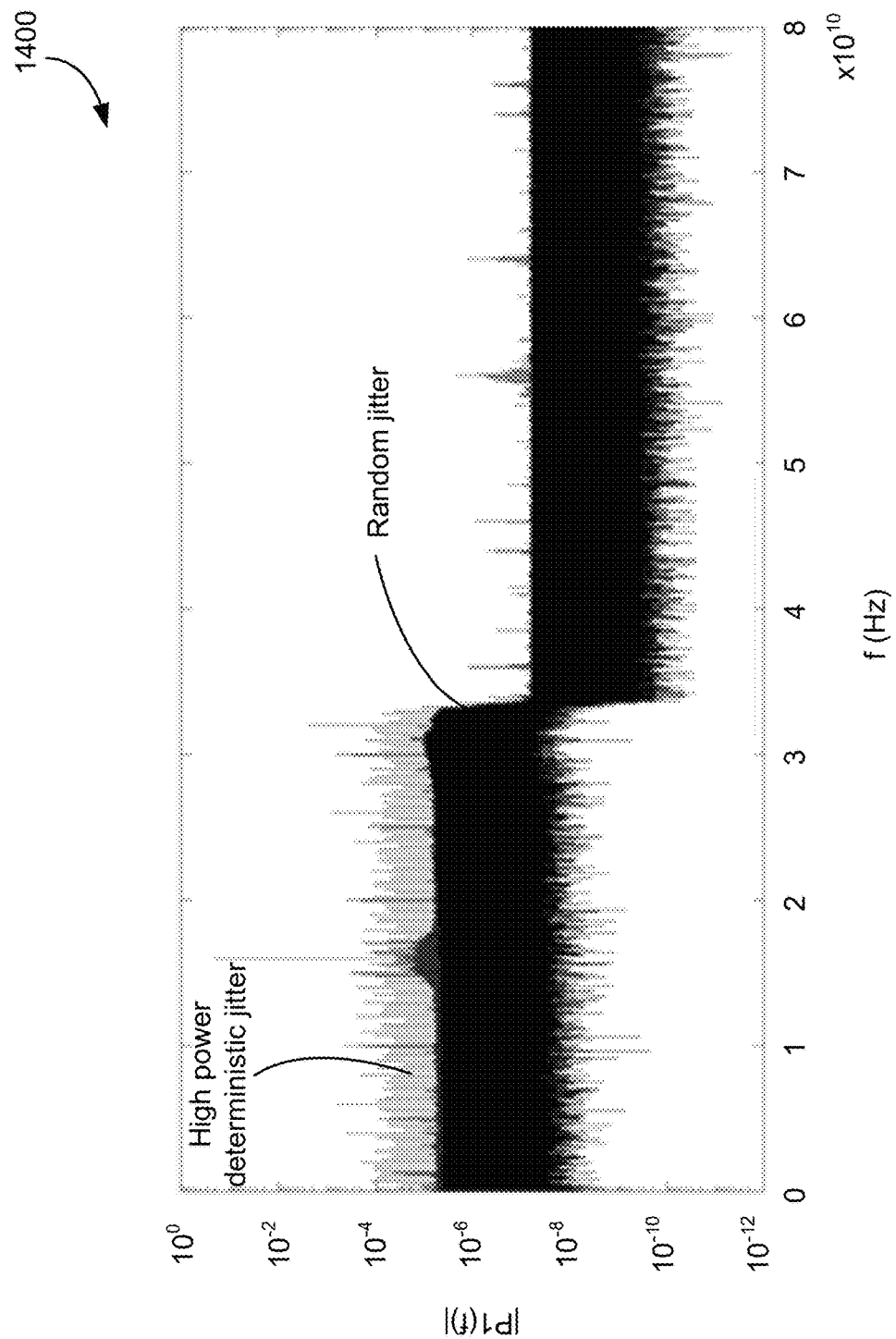
FIGS. 14-15 illustrate plots of electrical spectrum before and after squashing deterministic error, respectively, in accordance with some embodiments.
Figure 15:
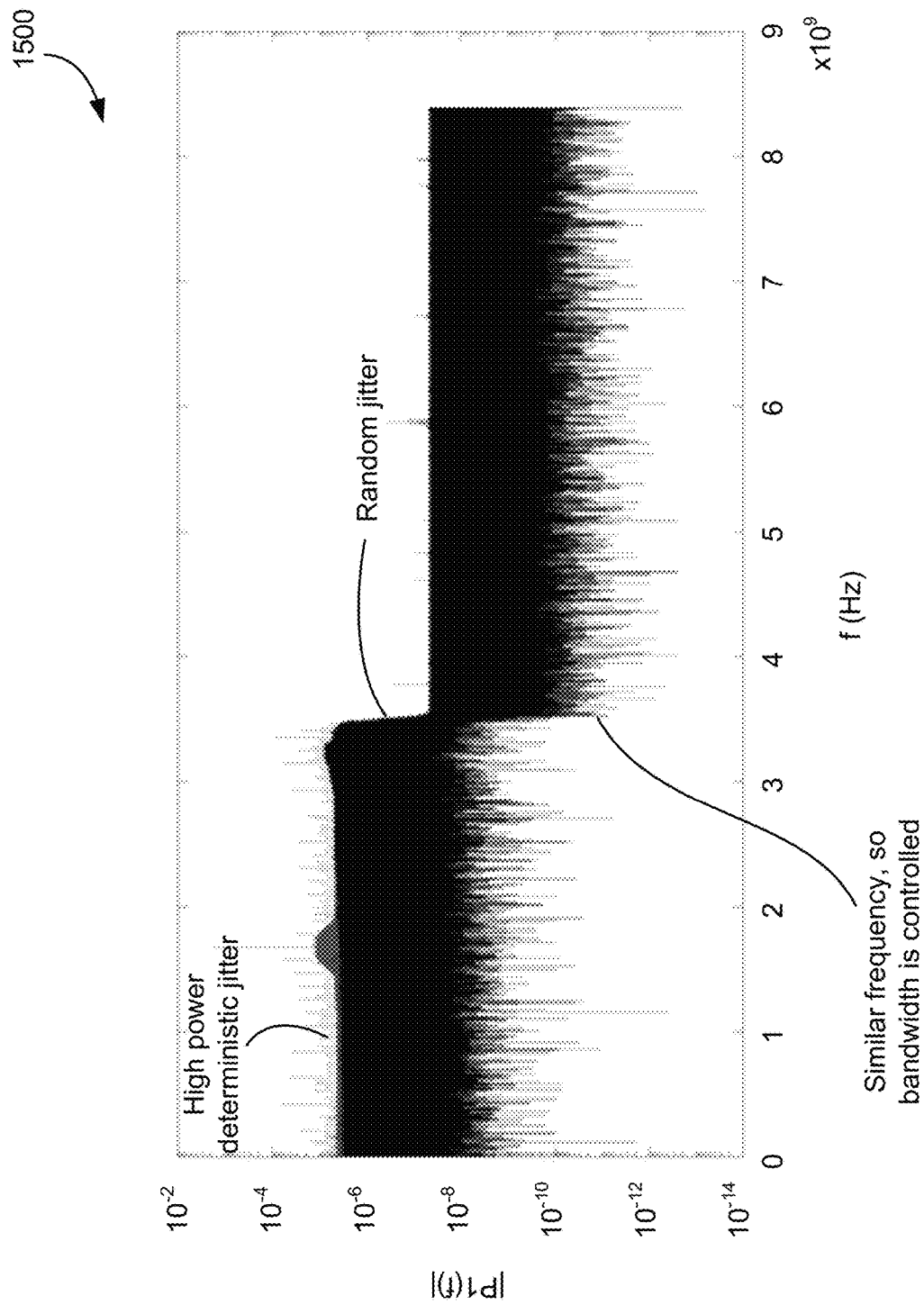

FIGS. 14-15 illustrate plots 1400 and 1500 of electrical spectrum before and after squashing deterministic error, respectively, in accordance with some embodiments. In some embodiments, a method is provided to achieve the slope of the edges for both toggle and noise floor waveform.

These slopes support accurate jitter transfer from voltage to timing error during noise floor jitter analysis. In some embodiments, random noise can be analyzed from noise floor and this RMS value is translated into random jitter by dividing ratio of the slope. For example, Taylor series can be used to explain phase jitter. If f(x) has arbitrary-order derivative when $x=x_o$, then $$\sum_{n=0}^{\infty} \frac{f^{(n)}(x_0)}{n!}(x-x_0)^n = f(x_0) + f'(x_0)(x-x_0) + \frac{f''(x_0)}{2!}(x-x_0)^2 + \ldots + \frac{f^{(n)}(x_0)}{n!}(x-x_0)^n + \ldots \quad (4)$$

Here, $f(x_o)$ is the ideal timing position without any phase shift error, $f'(x_o)$ is the ideal timing position without any phase shift error, and $f'(x_o)(x-x_o)$ is the first order error added as phase jitter, which is generated from silicon thermal noise, oscilloscope noise floor, etc. By computing the first order derivative dv/dt and delta value of voltage dv, dt (phase jitter from oscilloscope noise floor) is achieved by dv/(dv/dt). In some embodiments, first order derivative is used for random jitter, which is mainly while noise and a strain line resulting in linear dv/dt is in phase distribution. In other embodiments, higher order derivative may be used. dv/dt can be achieved as:

$$dv/dt = \frac{wf(m+1) - wf(m)}{t_{step}} \quad (5)$$

Where wf is the voltage array from oscilloscope capture, m and m+1 are the nearest points after interpolation around 0V (as 0V is the threshold voltage for differential signals); $t_{step}$ is the sampling step after interpolation. RMS noise floor and RMS jitter from noise floor can be expressed as:

$$RMS_{noise\ floor} = rms(wf_{noise\ floor}) \quad (6)$$

$$RMS_{jitter\ from\ noise\ floor} = RMS_{noise\ floor}/dvdt \quad (7)$$

In electrical spectrum, there is no phase round off error. As such, spikes from toggle waveform and noise floor waveform can correlate with each other even better. Accordingly, the remaining spikes (e.g., the ones for noise floor analysis), are much less than the ones in phase spectrum. Therefore, the spikes from noise floor to clocks can be recognized and removed better.

As the deterministic jitters from oscilloscope are delivered by oscilloscope noise floor waveform, one way to quantify them is tracking with spectrum of the noise floor. Both the phase spectrum for synthetic methodology and the electrical spectrum for dv/dt methodology described herein can track the jitter from oscilloscope noise floor and remove them from the toggle signal.

Figure 16:
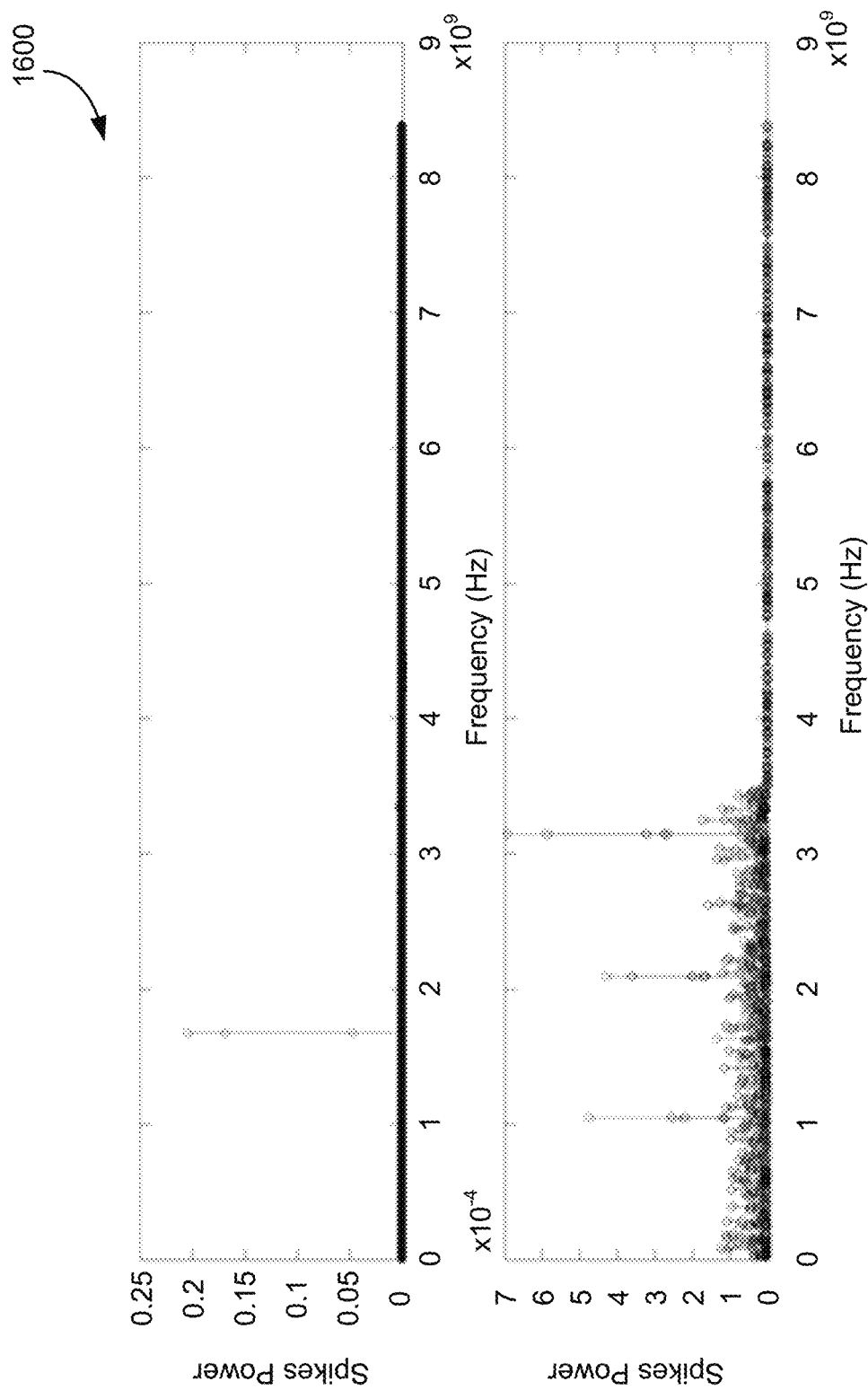
FIG. 16 illustrates plots showing tracking of spikes in electrical spectrum.

FIG. 16 illustrates plot 1600 showing tracking of spikes in electrical spectrum. Here, the total number of spikes in noise floor spectrum is set at m, while the number of communal spikes, which can be found in both noise floor and clock spectrums, is n. The coefficient of spikes in toggle and noise floor is 85.25%, as n/m. As seen from FIG. 16, it is highly efficient and accurate to separate deterministic jitters from random jitter in this way.

Figure 17:
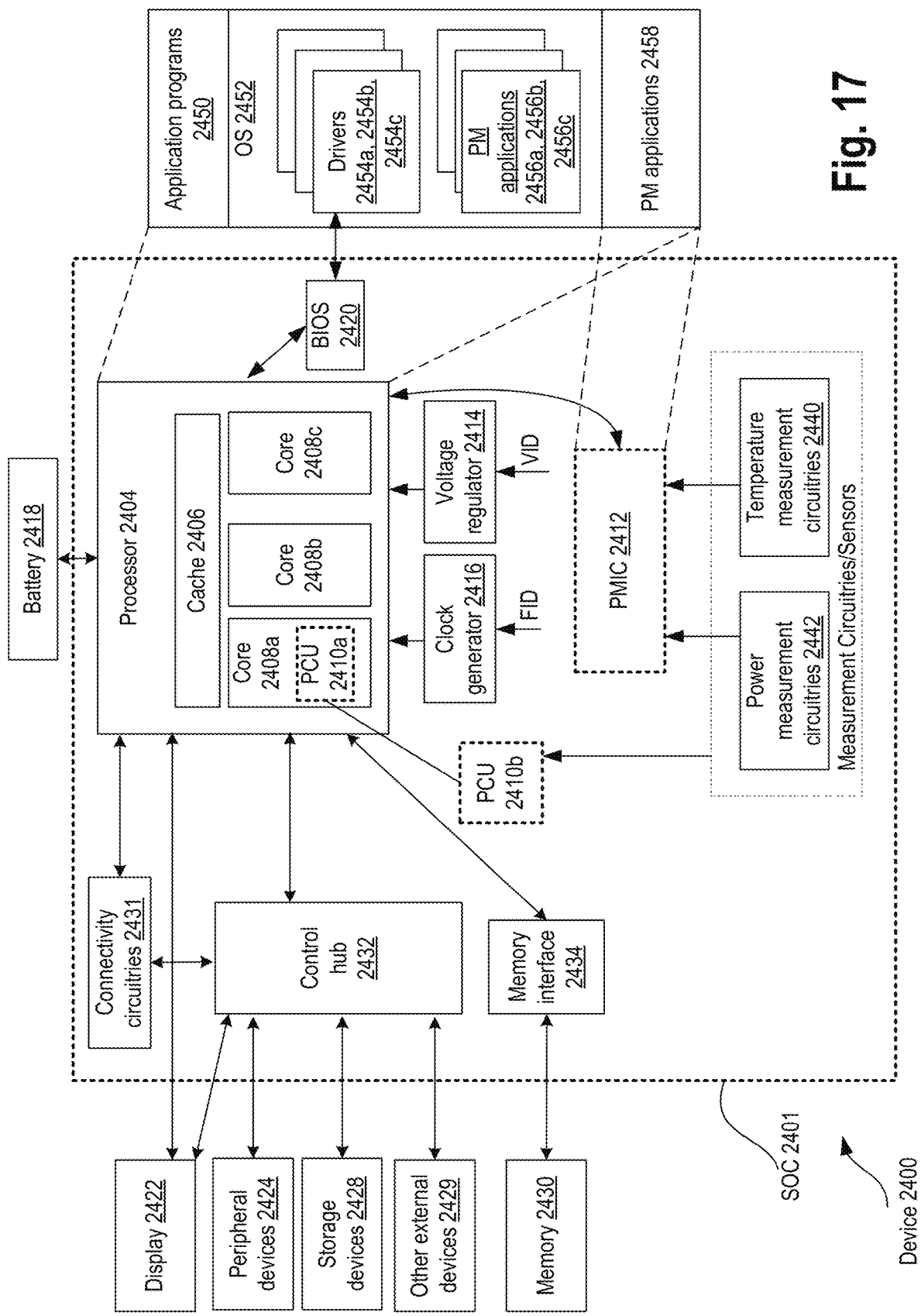
FIG. 17 illustrates a smart device or a computer system or an SoC (System-on-Chip) which is operable to post process oscilloscope data to de-embed noise floor, in accordance with various embodiments.

FIG. 17 illustrates a smart device or a computer system or an SoC (System-on-Chip) which is operable to post process oscilloscope data to de-embed noise floor, in accordance with various embodiments. It is pointed out that those elements of FIG. 17 having the same reference numbers (or names) as the elements of any other figure can operate or function in any manner similar to that described, but are not limited to such.

In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises a SoC (System-on-Chip) 2401. An example boundary of the SOC 2401 is illustrated using dotted lines in FIG. 17, with some example components being illustrated to be included within SOC 2401—however, SOC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 17, processor 2404 may include any other appropriate number of processing cores, e.g., tens, or even hundreds of processing cores. Processor cores 2408a, 2408b, 2408c may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408a, a second section of cache 2406 dedicated to core 2408b, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 2404 may also include a bus unit to enable communication between components of processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, a cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, control hub 2432 provides a hardware-based wake detection and SoC firmware/software support, for servicing fixed display port (DP) and High Definition Multimedia Interface (HDMI) port hot plug events which allow a Universal Serial Bus (USB) Type-C subsystem to go into a powered off state (e.g., D3COLD state) while the fixed display is not streaming Upon receiving a display software-initiated wake for fixed display streaming in response to a hot plug detect, the SoC USB Type-C firmware triggers exit low-power state flow to power up the USB USB Type-C subsystem to handle the display traffic. The SoC USB Type-C firmware has the capability to autonomously re-enter the low power state (e.g., D3COLD state) when the fixed display(s) are not streaming.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments, and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400.

In some embodiments, memory 2430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 2430 can be a dynamic random access memory (DRAM) device, a static random access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408a, 2408b, 2408c, voltage regulator 2414, memory 2430, a mother-board of SOC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SOC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, constant-on-time controller based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 2410a/b and/or PMIC 2412. In some embodiments, each core has a network of distributed LDOs to provide efficient control for power management. The LDOs can be digital, analog, or a combination of digital or analog LDOs. In some embodiments, VR 2414 includes current tracking apparatus to measure current through power supply rail(s).

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410a. In an example, some other sections of PCU 2410 may be implemented outside the processing cores 2408, and these sections of PCU 2410 are symbolically illustrated using a dotted box and labelled as PCU 2410b. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456a, 2456b, 2456c. The OS 2452 may also include various drivers 2454a, 2454b, 2454c, etc., some of which may be specific for power management purposes. In some embodiments, device 2400 may further comprise a Basic Input/Output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Various embodiments described herein are illustrated as examples. The features of these examples can be combined with one another in any suitable way. These examples include:

Example 1: A machine-readable storage media having machine readable instructions stored thereon that when executed cause a processor to perform a method comprising: receiving clock waveform from an oscilloscope, wherein the clock waveform includes noise floor waveform and toggling signal; reshaping the noise floor waveform based on sampling points per edges of the toggling signal; squashing deterministic jitter in the toggling signal in response to reshaping the noise floor waveform, wherein the deterministic jitter is delivered from the noise floor to the toggling signal; controlling bandwidth of random noise of the noise floor in response to squashing the deterministic jitter such that the bandwidth of the random noise is substantially same as bandwidth of the toggling signal; determining random jitter from the random noise; and de-embedding the noise floor by identifying random jitter.

Example 2: The machine-readable storage media of example 1, wherein the random jitter corresponds to time uncertainty while random noise corresponds to a voltage uncertainty.

Example 3: The machine-readable storage media of example 1, wherein reshaping the noise floor comprises: determining frequency of the toggling signal; applying one of: interpolation to the toggling signal if the frequency is above a threshold; or moving average filter to the toggling signal if the frequency is below the threshold; and determining edges of the toggling signal after applying one of the interpolation or the moving average filter; and sampling the random noise at the edges of the toggling signal.

Example 4: The machine-readable storage media of example 2, wherein applying interpolation comprises applying piecewise cubic Hermite interpolating polynomial.

Example 5: The machine-readable storage media of claim 3, wherein the threshold is about 100 MHz.

Example 6: The machine-readable storage media of example 1, wherein squashing deterministic jitter comprises: applying fast Fourier transform on the clock waveform to convert the random noise from time domain into an electric spectrum; sweeping the deterministic jitter by comparing powers of neighboring discrete points in the electrical spectrum; recording power and frequency of the deterministic jitter; and reducing magnitude of the deterministic jitter to squash the deterministic jitter in response to recording power and frequency of the deterministic jitter.

Example 7: The machine-readable storage media of example 6, wherein controlling the bandwidth of the random noise comprising: determining effective bandwidth of the random noise in the electric spectrum; multiplying the clock waveform with a transfer function of a clock data recovery circuitry; and applying inverse fast Fourier transform to convert the random noise from the electrical spectrum into time domain.

Example 8: The machine-readable storage media of example 1, wherein determining random jitter from the random noise comprises multiplying slope of the toggling signal with the random noise.

Example 9: A machine-readable storage media having machine readable instructions stored thereon that when executed cause a processor to perform a method comprising: receiving clock waveform from an oscilloscope, wherein the clock waveform includes noise floor waveform and toggling signal; determining a relationship between the noise floor and phase jitter in the toggling signal; identifying random jitter from random noise of the noise floor; and de-embedding the noise floor by identifying random jitter.

Example 10: The machine-readable storage media of example 9, wherein determining the relationship, between the noise floor and phase jitter in the toggling signal, comprises: reshaping the noise floor waveform based on sampling points per edges of the toggling signal; squashing deterministic jitter in the toggling signal in response to reshaping the noise floor waveform, wherein the deterministic jitter is delivered from the noise floor to the toggling signal; and controlling bandwidth of random noise of the noise floor in response to squashing the deterministic jitter such that the bandwidth of the random noise is substantially same as bandwidth of the toggling signal.

Example 11: The machine-readable storage media of example 9, wherein reshaping the noise floor comprises: determining frequency of the toggling signal; applying one of: interpolation to the toggling signal if the frequency is above a threshold; or moving average filter to the toggling signal if the frequency is below the threshold; and determining edges of the toggling signal after applying one of the interpolation or the moving average filter; and sampling the random noise at the edges of the toggling signal.

Example 12: The machine-readable storage media of example 9, wherein squashing deterministic jitter comprises: applying fast Fourier transform on the clock waveform to convert the random noise from time domain into an electric spectrum; sweeping the deterministic jitter by comparing powers of neighboring discrete points in the electrical spectrum; recording power and frequency of the deterministic jitter; and reducing magnitude of the deterministic jitter to squash the deterministic jitter in response to recording power and frequency of the deterministic jitter.

Example 13: The machine-readable storage media of example 12, wherein controlling bandwidth of the random noise comprises: determining effective bandwidth of the random noise in the electric spectrum; multiplying the clock waveform with a transfer function of a clock data recovery circuitry; and applying inverse fast Fourier transform to convert the random noise from the electrical spectrum into time domain.

Example 14: An oscilloscope comprising: an interface to receive a clock waveform, wherein the clock waveform includes noise floor waveform and toggling signal; and a processor communicatively coupled to the interface, wherein the processor is to: determine a relationship between the noise floor and phase jitter in the toggling signal; identify random jitter from random noise of the noise floor; and de-embed the noise floor by identifying random jitter.

Example 15: The oscilloscope of example 14, wherein to determine the relationship between the noise floor and phase jitter in the toggling signal, comprises: reshape the noise floor waveform based on sampling points per edges of the toggling signal; squash deterministic jitter in the toggling signal in response to reshaping the noise floor waveform, wherein the deterministic jitter is delivered from the noise floor to the toggling signal; and control bandwidth of random noise of the noise floor in response to squashing the deterministic jitter such that the bandwidth of the random noise is substantially same as bandwidth of the toggling signal.

Example 16: The oscilloscope of example 15, wherein to reshape the noise floor comprises to: determine frequency of the toggling signal; apply one of: interpolation to the toggling signal if the frequency is above a threshold; or moving average filter to the toggling signal if the frequency is below the threshold; and determine edges of the toggling signal after applying one of the interpolation or the moving average filter; and sample the random noise at the edges of the toggling signal.

Example 17: The oscilloscope of example 16, wherein applying interpolation comprises applying piecewise cubic Hermite interpolating polynomial.

Example 18: The oscilloscope of example 16, wherein the threshold is about 100 MHz.

Example 19: The oscilloscope of example 15, wherein to squash deterministic jitter comprises: apply fast Fourier transform on the clock waveform to convert the random noise from time domain into an electric spectrum; sweep the deterministic jitter by comparing powers of neighboring discrete points in the electrical spectrum; record power and frequency of the deterministic jitter; and reduce magnitude of the deterministic jitter to squash the deterministic jitter in response to recording power and frequency of the deterministic jitter.

Example 20: The oscilloscope of example 19, wherein to control the bandwidth of the random noise comprising: determine effective bandwidth of the random noise in the electric spectrum; multiplying the clock waveform with a transfer function of a clock data recovery circuitry; and apply inverse fast Fourier transform to convert the random noise from the electrical spectrum into time domain.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. A non-transitory computer-readable medium containing instructions stored therein for causing one or more processors to perform a method comprising:
   at a clock data recovery circuitry, receiving a data signal from a circuit, wherein the circuit is to provide the data signal in response to a clock from a clock source, and the clock data recovery circuitry is to sample the data signal based on the clock from the clock source to provide a toggling signal;
   at an oscilloscope, receiving the toggling signal and adding a noise floor waveform of the oscilloscope to the toggling signal to provide a clock waveform;
   reshaping the noise floor waveform based on sampling points per edges of the toggling signal;
   squashing deterministic jitter in the toggling signal in response to the reshaping wherein the deterministic jitter is delivered from the noise floor waveform to the toggling signal;
   controlling bandwidth of random noise of the noise floor waveform in response to the squashing to be substantially same as a bandwidth of the toggling signal;
   determining random jitter from the random noise, the determining of the random jitter comprising multiplying slopes of the edges of the toggling signal with the random noise; and
   after the determining of the random jitter, de-embedding the random jitter from the noise floor waveform, wherein the de-embedding reduces a phase jitter in the toggling signal to within a jitter limitation which is less than an uncertainty from the noise floor waveform of the oscilloscope; wherein the reshaping comprises:
   determining a frequency of the toggling signal;
   applying one of: interpolation to the toggling signal if the frequency is above a threshold;
   or a moving average filter to the toggling signal if the frequency is below the threshold;
   determining the edges of the toggling signal after applying one of the interpolation or the moving average filter; and sampling the random noise at the edges of the toggling signal.

2. The non-transitory computer-readable medium of claim 1, wherein the random jitter corresponds to time uncertainty while the random noise corresponds to a voltage uncertainty.

3. The non-transitory computer-readable medium of claim 1, wherein the applying of the interpolation comprises applying a piecewise cubic Hermite interpolating polynomial.

4. The non-transitory computer-readable medium of claim 1, wherein the threshold is about 100 MHz.

5. The non-transitory computer-readable medium of claim 1, wherein the squashing deterministic jitter comprises: applying a fast Fourier transform on the clock waveform to convert the random noise from a time domain into an electric spectrum;
sweeping the deterministic jitter by comparing powers of neighboring discrete points in the electric spectrum;
recording power and frequency of the deterministic jitter; and
reducing a magnitude of the deterministic jitter to squash the deterministic jitter in response to the recording of the power and frequency of the deterministic jitter.

6. The non-transitory computer-readable medium of claim 5, wherein the controlling of the bandwidth of the random noise comprises:
determining an effective bandwidth of the random noise in the electric spectrum;
multiplying the clock waveform with a transfer function of the clock data recovery circuitry; and
applying an inverse fast Fourier transform to convert the random noise from the electric spectrum into the time domain.

7. The non-transitory computer-readable medium of claim 1, wherein the jitter limitation is a jitter limitation of a Peripheral Component Interconnect Express (PCIe) specification.

8. The non-transitory computer-readable medium of claim 1, wherein the clock in the clock data recovery circuitry is coupled to the oscilloscope by a probe.

9. The non-transitory computer-readable medium of claim 1, wherein the reshaping comprises keeping sampling points aligned with positions of the edges of the toggling signal, and dropping other sampling points that are not aligned with the positions of the edges of the toggling signal.

10. The non-transitory computer-readable medium of claim 1, wherein the one or more processors are in a post-processing computer terminal coupled to the oscilloscope.

11. The non-transitory computer-readable medium of claim 1, wherein the clock data recovery circuitry comprise a flip-flop to sample the data signal.

12. A non-transitory computer-readable medium containing instructions stored therein for causing one or more processors to perform a method comprising:
at a clock data recovery circuitry, receiving a data signal from a circuit, wherein the circuit is to provide the data signal in response to a clock from a clock source, and the clock data recovery circuitry is to sample the data signal based on the clock from the clock source to provide a toggling signal;
at an oscilloscope, receiving the toggling signal and adding, a noise floor waveform of the oscilloscope to the toggling signal;
determining a relationship between the noise floor waveform and phase jitter in the toggling signal;
identifying random jitter from random noise of the noise floor waveform; and
de-embedding the random jitter from the noise floor waveform to reduce the phase jitter to within a jitter limitation which is less than an uncertainty from the noise floor waveform of the oscilloscope;
wherein the determining of the relationship, comprises:
reshaping the noise floor waveform based on sampling points per edges of the toggling signal;
squashing deterministic jitter in the toggling signal in response to the reshaping, wherein the deterministic jitter is delivered from the noise floor waveform to the toggling signal; and
controlling a bandwidth of the random noise of the noise floor waveform in response to the squashing to be substantially same as a bandwidth of the toggling signal;
wherein the squashing comprises:
applying a fast Fourier transform on a clock waveform to convert the random noise from a time domain into an electric spectrum;
sweeping the deterministic jitter by comparing powers of neighboring discrete points in the electric spectrum;
recording a power and frequency of the deterministic jitter; and
reducing a magnitude of the deterministic jitter to squash the deterministic jitter in response to the recording; and
wherein the controlling the bandwidth of the random noise comprises:
determining an effective bandwidth of the random noise in the electric spectrum;
multiplying the clock waveform with a transfer function of the clock data recovery circuitry; and
applying an inverse fast Fourier transform to convert the random noise from the electric spectrum into the time domain.

13. The non-transitory computer-readable medium of claim 12, wherein reshaping the noise floor waveform comprises: determining a frequency of the toggling signal;
applying one of: interpolation to the toggling signal if the frequency is above a threshold;
or a moving average filter to the toggling signal if the frequency is below the threshold; and determining the edges of the toggling signal after applying one of the interpolation or the moving average filter; and sampling the random noise at the edges of the toggling signal.

14. The non-transitory computer-readable medium of claim 12, wherein the clock is coupled to the oscilloscope by a probe.

15. A computer system, comprising:
a clock data recovery circuitry to receive a data signal from a circuit, wherein the circuit is to provide the data signal in response to a clock from a clock source, and the clock data recovery circuitry is to sample the data signal based on the clock from the clock source to provide a toggling signal;
an oscilloscope to receive the toggling signal and add a noise floor waveform of the oscilloscope to the toggling signal to provide a clock waveform;
an interface to receive the clock waveform from the oscilloscope; and
a processor coupled to the interface, to:
determine a relationship between the noise floor waveform and phase jitter in the toggling signal;
identify random jitter from random noise of the noise floor waveform; and
de-embed the random jitter from the noise floor waveform;
wherein to determine the relationship the processor is to:
reshape the noise floor waveform based on sampling points per edges of the toggling signal;

squash deterministic jitter in the toggling signal in response to the reshaping, wherein the deterministic jitter is delivered from the noise floor waveform to the toggling signal; and
control bandwidth of the random noise of the noise floor waveform in response to the squashing to be substantially same as a bandwidth of the toggling signal;
wherein in the reshaping, the processor is to:
determine a frequency of the toggling signal;
apply one of:
interpolation to the toggling signal if the frequency is above a threshold, wherein the applying of the interpolation comprises applying a piecewise cubic Hermite interpolating polynomial; or
a moving average filter to the toggling signal if the frequency is below the threshold;
determine the edges after applying one of the interpolation or the moving average filter; and
sample the random noise at the edges; and
wherein in the squashing, the processor is to:
apply a fast Fourier transform on the clock waveform to convert the random noise from a time domain into an electric spectrum;
sweep the deterministic jitter by comparing powers of neighboring discrete points in the electric spectrum;
record a power and frequency of the deterministic jitter; and
reduce a magnitude of the deterministic jitter to squash the deterministic jitter in response to the recording.

16. The computer system of claim 15, wherein the threshold is about 100 MHz.

17. The computer system of claim 15, wherein to control the bandwidth of the random noise, the processor is to:
determine an effective bandwidth of the random noise in the electric spectrum;
multiply the clock waveform with a transfer function of the clock data recovery circuitry; and
apply an inverse fast Fourier transform to convert the random noise from the electric spectrum into the time domain.

18. The computer system of claim 15, wherein the toggling signal is of the clock which is coupled to the oscilloscope by a probe.

19. The computer system of claim 15, wherein the de embedding reduces the phase jitter to within a jitter limitation which is less than an uncertainty from the noise floor waveform of the oscilloscope.

* * * * *